(12) United States Patent
Lie et al.

(10) Patent No.: US 10,490,481 B1
(45) Date of Patent: Nov. 26, 2019

(54) COPPER MICROCOOLER STRUCTURE AND FABRICATION

(71) Applicant: International Business Machines Corporation, Armonk, NY (US)

(72) Inventors: Fee Li Lie, Albany, NY (US); Kamal K. Sikka, Poughkeepsie, NY (US); Donald Francis Canaperi, Bridgewater, CT (US); Daniel A. Corliss, Waterford, NY (US); Dinesh Gupta, Hopewell Junction, NY (US); Dario Goldfarb, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/132,829

(22) Filed: Sep. 17, 2018

Related U.S. Application Data

(63) Continuation of application No. 16/106,918, filed on Aug. 21, 2018.

(51) Int. Cl.
*H01L 23/34* (2006.01)
*H01L 23/373* (2006.01)
*H01L 23/367* (2006.01)
*H01L 23/473* (2006.01)
*H01L 23/00* (2006.01)

(52) U.S. Cl.
CPC ........ *H01L 23/3735* (2013.01); *H01L 23/367* (2013.01); *H01L 23/473* (2013.01); *H01L 24/09* (2013.01)

(58) Field of Classification Search
CPC . H01L 23/473; H01L 23/3735; H01L 23/367; H01L 24/09
USPC .......................................................... 257/712
See application file for complete search history.

(56) References Cited

U.S. PATENT DOCUMENTS

| | | |
|---|---|---|
| 5,199,487 A | 4/1993 | DiFrancesco et al. |
| 5,317,805 A | 6/1994 | Hoopman et al. |
| 5,727,618 A | 3/1998 | Mundinger et al. |
| 5,737,186 A | 4/1998 | Fuesser et al. |
| 6,865,081 B2 | 3/2005 | Meyer et al. |

(Continued)

OTHER PUBLICATIONS

Colgan, "A Practical Implementation of Silicon Microchannel Coolers," vol. 13, Nov. 1, 2007, 12 pages.

(Continued)

*Primary Examiner* — Luan C Thai
(74) *Attorney, Agent, or Firm* — Amin, Turocy & Watson, LLP

(57) ABSTRACT

Techniques that facilitate a copper microcooler structure are provided. In one example, a device includes a first copper microcooler structure and a second copper microcooler structure. The first copper microcooler structure includes a first copper plate and a first set of copper channels attached to the first copper plate. The second copper microcooler structure includes a second copper plate and a second set of copper channels attached to the second copper plate. A surface of the second copper plate associated with the second copper microcooler structure is bonded to one or more surfaces of the first set of copper channels associated with the first copper microcooler structure via a fusion bond.

20 Claims, 17 Drawing Sheets

FIG. 3

(56) References Cited

U.S. PATENT DOCUMENTS

| | | | |
|---|---|---|---|
| 7,115,987 B2 | 10/2006 | Holalkere et al. | |
| 7,987,899 B2* | 8/2011 | Kurtz | F28F 3/048 |
| | | | 165/168 |
| 8,591,078 B2* | 11/2013 | Igl | F21V 29/58 |
| | | | 362/373 |
| 2005/0002632 A1 | 1/2005 | Mizuno et al. | |
| 2005/0141195 A1 | 1/2005 | Pokharna et al. | |
| 2005/0263273 A1 | 12/2005 | Crumly | |
| 2007/0126116 A1 | 6/2007 | Dangelo | |
| 2008/0196875 A1 | 8/2008 | Kurtz et al. | |
| 2017/0299239 A1* | 10/2017 | Steven | F25B 39/00 |

OTHER PUBLICATIONS

Colgan, et al., "A Practical Implementation of Silicon Microchannel Coolers for High Power Chips," IEEE Transactions on Components and Packaging Technologies, vol. 30, No. 2, Jun. 2007, 8 pages.

Han, et al., "Si-Based Hybrid Microcooler With Multiple Drainage Microtrenches for High Heat Flux Cooling," Last Accessed: Jun. 25, 2018, 8 pages.

Lau, et al., "Development of fluxless bonding using deposited gold-indium multi-layer composite for heterogeneous silicon microcooler stacking," 2014 IEEE, 5 pages.

Lau, et al., "Fabrication of Package Level Silicon Micro-cooler for Electronics Cooling," Last Accessed: Jun. 25, 2018, 7 pages.

Tang, et al., "Development of a Compact and Efficient Liquid Cooling System With Silicon Microcooler for High-Power Microelectronic Devices," IEEE Transactions on Components, Packaging and Manufacturing Technology, vol. 6, No. 5, May 2016, 11 pages.

Yamada, et al., "High Performance Microcooler Fabricated by Multiple Stacking of Electroplated Metal Patterns," The 14th International Conference on Solid-State Sensors, Actuators and Microsystems, Lyon, France, Jun. 10-14, 2007, 4 pages.

List of IBM Patents or Applications Treated as Related.

* cited by examiner

COPPER MICROCOOLER STRUCTURE AND FABRICATION

BACKGROUND

The subject disclosure relates to semiconductors, and more specifically, to semiconductor design and fabrication.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that provide a copper microcooler structure and fabrication are described.

According to an embodiment, a device can comprise a first copper microcooler structure and a second copper microcooler structure. The first copper microcooler structure can comprise a first copper plate and a first set of copper channels attached to the first copper plate. The second copper microcooler structure can comprise a second copper plate and a second set of copper channels attached to the second copper plate. A surface of the second copper plate associated with the second copper microcooler structure can be bonded to one or more surfaces of the first set of copper channels associated with the first copper microcooler structure via a fusion bond.

According to another embodiment, a method is provided. The method can comprise depositing a first copper liner on a first set of patterned fins fabricated from a first silicon wafer to generate a first set of copper channels. The method can also comprise depositing a second copper liner on a second set of patterned fins fabricated from a second silicon wafer to generate a second set of copper channels. Additionally, the method can comprise bonding the second set of copper channels to the first set of copper channels to generate a microcooler structure.

According to yet another embodiment, a device can comprise a first copper microcooler structure, a second copper microcooler structure and a third copper microcooler structure. The first copper microcooler structure can comprise a first copper plate and a first set of copper channels attached to the first copper plate. The second copper microcooler structure can comprise a second copper plate and a second set of copper channels attached to the second copper plate. The third copper microcooler structure can comprises a third copper plate and a third set of copper channels attached to the third copper plate. A surface of the second copper plate associated with the second copper microcooler structure can be bonded to one or more surfaces of the first set of copper channels associated with the first copper microcooler structure via a fusion bond. A different surface of the third copper plate associated with the third copper microcooler structure can be bonded to one or more different surfaces of the second set of copper channels associated with the second copper microcooler structure.

According to yet another embodiment, a method is provided. The method can comprise depositing a first copper liner on a first set of patterned fins fabricated from a first silicon wafer to generate a first set of copper channels. The method can also comprise depositing a second copper liner on a second set of patterned fins fabricated from a second silicon wafer to generate a second set of copper channels. Additionally, the method can comprise removing the first silicon wafer from the first set of copper channels. Additionally, the method can comprise removing the second silicon wafer from the second set of copper channels. The method can also comprise bonding the second set of copper channels to the first set of copper channels to generate a microcooler structure.

According to yet another embodiment, a method is provided. The method can comprise depositing a first copper liner on a first set of patterned fins fabricated from a first silicon wafer to generate a first set of copper channels. The method can also comprise depositing a second copper liner on a second set of patterned fins fabricated from a second silicon wafer to generate a second set of copper channels. Additionally, the method can comprise bonding the second set of copper channels to the first set of copper channels. The method can also comprise bonding a copper plate to the second set of copper channels to generate a microcooler structure.

DETAILED DESCRIPTION

Figure 1:
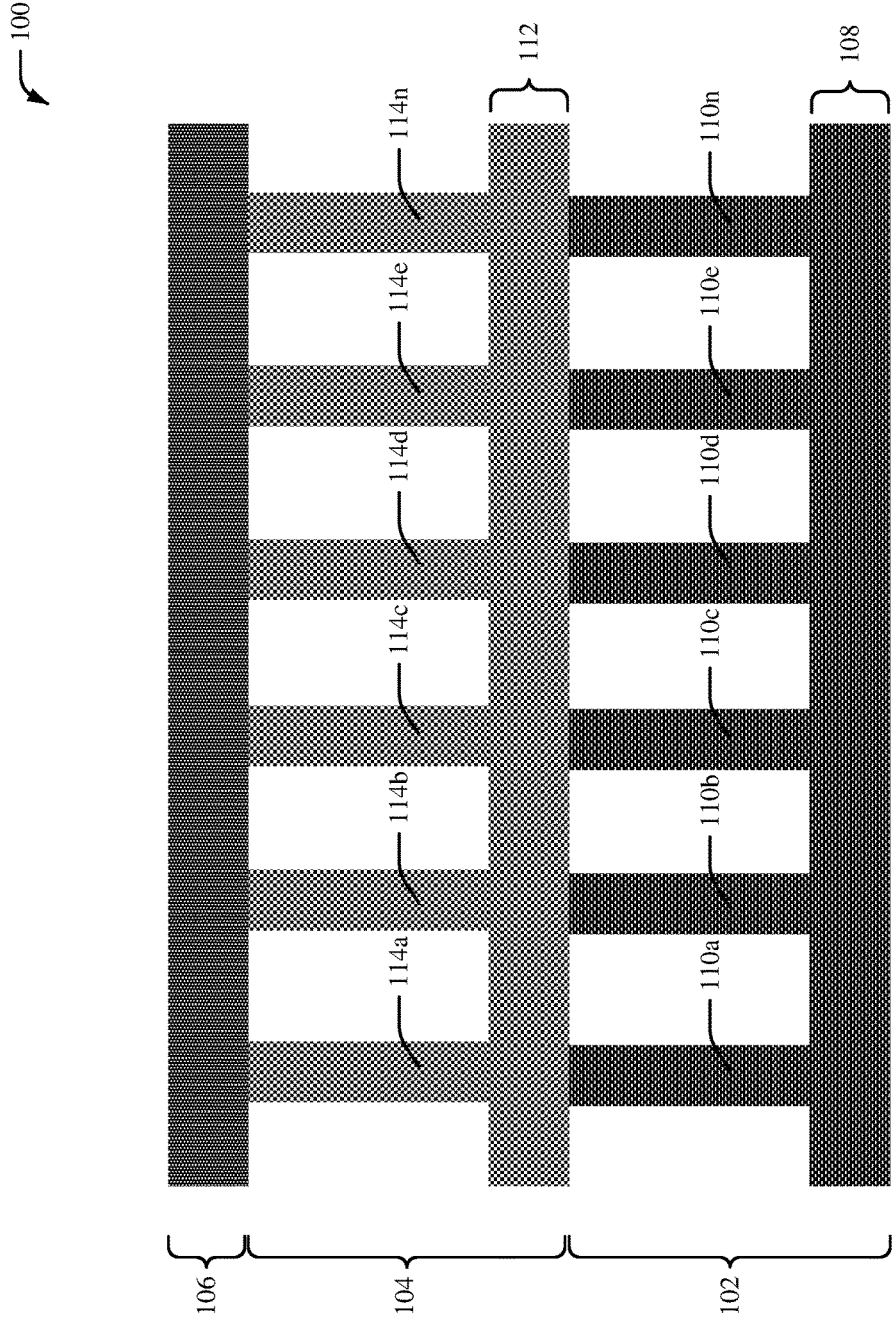
FIG. 1 illustrates an example, non-limiting device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A microcooler is a cooling device employed to reduce temperature of one or more electronic components. For instance, a microcooler can be employed in a liquid cooling system to maintain a temperature of one or more electronic components within a certain temperature range and/or to reduce a temperature of the one or more electronic components. In certain instances, a coolant fluid can be passed through a microcooler to maintain a temperature of one or more electronic components within a certain temperature range and/or to reduce a temperature of the one or more electronic components. For example, a fluid inlet can receive coolant fluid, the coolant fluid can pass through channels of the microcooler, and the coolant fluid can exit a fluid exit. A microcooler can be fabricated by micromachining a copper structure. However, conventional microcoolers fabricated by micromachining have limited channel and fin widths. Furthermore, thermal characteristics of conventional microcoolers fabricated by micromachining can be improved.

Embodiments described herein include systems, methods, apparatuses and devices associated with copper microcooler structure and fabrication. For example, a novel microcooler structure (e.g., a novel copper microcooler structure) and/or novel microcooler fabrication techniques is disclosed herein to provide improved thermal characteristics and/or reduced channel and fin widths as compared to conventional microcoolers fabricated by micromachining. In an embodiment, a multilayer and multichannel copper microcooler can be provided with a fine channel width below, for example, 250 microns. In an aspect, the multilayer and multichannel copper microcooler can be fabricated by forming fin arrays in a silicon substrate using a microetching process, electroplating copper to fill inter-fin gaps, and performing a planarization process. The multilayer and multichannel copper microcooler can also be fabricated by aligning and stacking multiple copper microcoolers. The multiple copper microcoolers can be bonded, for example, using fusion bonding to form a multilayered stack. Furthermore, the multilayer and multichannel copper microcooler can also be fabricated by etching off silicon to provide a multilayer copper microcooler structure. The multilayer copper microcooler structure can include finer channels and fins of the multilayer copper microcooler structure can increase surface area for improved thermal dissipation. As such, thermal characteristics of the multilayer copper microcooler structure can be improved. For example, thermal capacity for the multilayer copper microcooler structure can be improved. Moreover, thermal management of an electronic component coupled to the multilayer copper microcooler structure can be improved, performance of an electronic component coupled to the multilayer copper microcooler structure can be improved, and/or damage to an electronic component coupled to the multilayer copper microcooler structure can be avoided.

FIG. 1 illustrates a side view of an example, non-limiting device 100 in accordance with one or more embodiments described herein. The device 100 can be, for example, microcooler structure. In an embodiment, the device 100 can be, for example, a copper microcooler structure. The device 100 can include a first copper microcooler structure 102, a second copper microcooler structure 104 and/or a copper plate 106. The first copper microcooler structure 102 can include a copper plate 108 and a first set of copper channels 110a-n. The first set of copper channels 110a-n can be attached to the copper plate 108. The second copper microcooler structure 104 can include a copper plate 112 and a second set of copper channels 114a-n. The second set of copper channels 114a-n can be attached to the copper plate 112. In an aspect, the copper plate 106, the copper plate 108, the first set of copper channels 110a-n, the copper plate 112 and/or the second set of copper channels 114a-n can comprise copper. The copper plate 112 can be bonded to the first set of copper channels 110a-n. For example, the copper plate 112 can be bonded to the first set of copper channels 110a-n via a fusion bond. In an aspect, a surface of the copper plate 112 can be bonded to one or more surfaces of the first set of copper channels 110a-n via a fusion bond. Additionally, the copper plate 106 can be bonded to the second set of copper channels 114a-n. For example, the copper plate 106 can be bonded to the second set of copper channels 114a-n via a fusion bond. In an aspect, a surface of the copper plate 106 can be bonded to one or more surfaces of the second set of copper channels 114a-n via a fusion bond. In an embodiment, the second set of copper channels 114a-n can be approximately aligned with the first set of copper channels 110a-n. For example, at least one copper channel from the second set of copper channels 114a-n can be offset from a corresponding copper channel from the first set of copper channels 110a-n by a certain amount. In a non-limiting example, the copper channel 114a can be offset from the copper channel 110a by a certain amount. In another embodiment, a width of one or more copper channels from the first set of copper channels 110a-n and/or the second set of copper channels 114a-n can be less than 250 microns. In an aspect, the second copper microcooler structure 104 can be bonded to the first set of copper channels 110a-n of the first copper microcooler structure 102 to provide improved thermal capacity for the device 100. Additionally, it is to be appreciated that, in certain embodiments, the device 100 can include one or more additional copper microcooler structures (e.g., the device 100 can include more than two copper microcooler structures). Additionally, it is to be appreciated that, the first set of copper channels 110*a-n* can include any number of copper channels, and/or the second set of copper channels 114*a-n* can include any number of copper channels. In certain embodiments, the device 100 can be employed in a cooling system (e.g., a liquid cooling system) to maintain a temperature of one or more electronic components within a certain temperature range and/or to reduce a temperature of the one or more electronic components. In certain embodiments, a coolant fluid can be passed through the device 100 (e.g., the first set of copper channels 110*a-n* and/or the second set of copper channels 114*a-n*) to maintain a temperature of one or more electronic components within a certain temperature range and/or to reduce a temperature of the one or more electronic components. In certain embodiments, an inlet manifold can receive the coolant fluid and can supply the coolant fluid to the device 100 (e.g., the first set of copper channels 110*a-n* and/or the second set of copper channels 114*a-n*). The coolant fluid can be a liquid coolant. In some embodiments, the coolant fluid can be a liquid dielectric coolant. For example, the coolant fluid can be a liquid dielectric coolant such as a refrigerant (e.g., R1234ze, R134a, R245fa, etc.) or another type of liquid dielectric coolant (e.g., ammonia, etc.). In another embodiment, the coolant fluid can be water.

Figure 2:
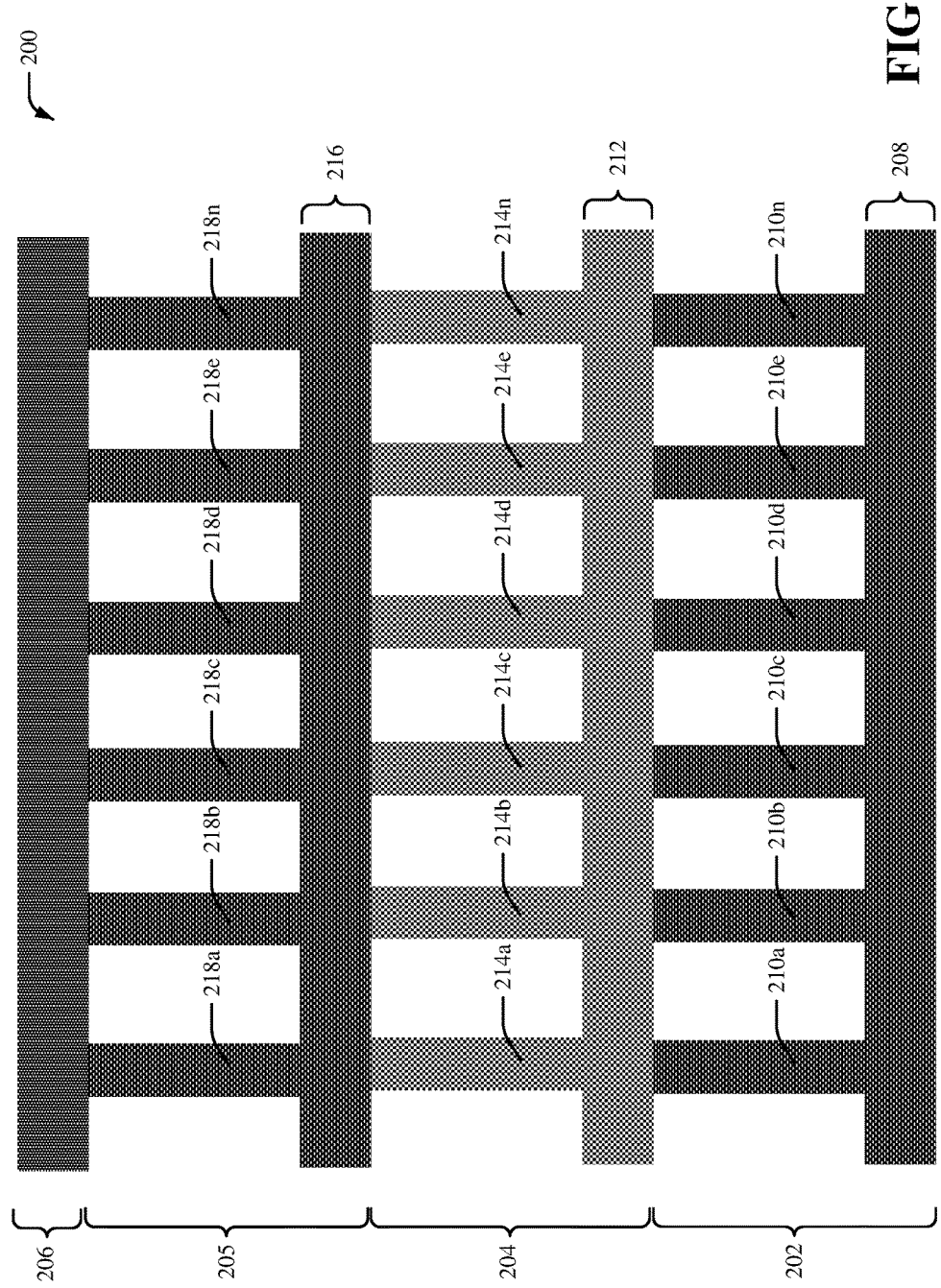
FIG. 2 illustrates another example, non-limiting device in accordance with one or more embodiments described herein.

FIG. 2 illustrates a side view of an example, non-limiting device 200 in accordance with one or more embodiments described herein. Repetitive description of like elements employed in other embodiments described herein is omitted for sake of brevity.

The device 200 can be, for example, an alternate embodiment of the device 100. The device 200 can be, for example, microcooler structure. In an embodiment, the device 200 can be, for example, a copper microcooler structure. The device 200 can include a first copper microcooler structure 202, a second copper microcooler structure 204, a third copper microcooler structure 205 and/or a copper plate 206. The first copper microcooler structure 202 can include a copper plate 208 and a first set of copper channels 210*a-n*. The first set of copper channels 210*a-n* can be attached to the copper plate 208. The second copper microcooler structure 204 can include a copper plate 212 and a second set of copper channels 214*a-n*. The second set of copper channels 214*a-n* can be attached to the copper plate 216. The third copper microcooler structure 205 can include a copper plate 216 and a third set of copper channels 218*a-n*. In an aspect, the copper plate 206, the copper plate 208, the first set of copper channels 210*a-n*, the copper plate 212, the second set of copper channels 214*a-n*, the copper plate 216 and/or the third set of copper channels 218*a-n* can comprise copper. The third set of copper channels 218*a-n* can be attached to the copper plate 206. The copper plate 212 can be bonded to the first set of copper channels 210*a-n*. For example, the copper plate 212 can be bonded to the first set of copper channels 210*a-n* via a fusion bond. In an aspect, a surface of the copper plate 212 can be bonded to one or more surfaces of the first set of copper channels 210*a-n* via a fusion bond. Additionally, the copper plate 216 can be bonded to the second set of copper channels 214*a-n*. For example, the copper plate 216 can be bonded to the second set of copper channels 214*a-n* via a fusion bond. In an aspect, a surface of the copper plate 216 can be bonded to one or more surfaces of the second set of copper channels 214*a-n* via a fusion bond. Additionally, the copper plate 206 can be bonded to the third set of copper channels 218*a-n*. For example, the copper plate 206 can be bonded to the third set of copper channels 218*a-n* via a fusion bond. In an aspect, a surface of the copper plate 206 can be bonded to one or more surfaces of the third set of copper channels 218*a-n* via a fusion bond. In an embodiment, the second set of copper channels 214*a-n* can be approximately aligned with the first set of copper channels 210*a-n*. For example, at least one copper channel from the second set of copper channels 214*a-n* can be offset from a corresponding copper channel from the first set of copper channels 210*a-n* by a certain amount. In a non-limiting example, the copper channel 114*a* can be offset from the copper channel 210*a* by a certain amount. Additionally, the third set of copper channels 218*a-n* can be approximately aligned with the second set of copper channels 214*a-n* and/or the first set of copper channels 210*a-n*. For example, at least one copper channel from the third set of copper channels 214*a-n* can be offset from a corresponding copper channel from the second set of copper channels 214*a-n* and/or the first set of copper channels 210*a-n* by a certain amount. In a non-limiting example, the copper channel 218*a* can be offset from the copper channel 214*a* and/or the copper channel 210*a* by a certain amount. In another embodiment, a width of one or more copper channels from the first set of copper channels 210*a-n*, the second set of copper channels 214*a-n*, and/or the third set of copper channels 218*a-n* can be less than 250 microns. In an aspect, the second copper microcooler structure 204 can be bonded to the first set of copper channels 110*a-n* and/or the third copper microcooler structure 205 can be bonded to the second set of copper channels 214*a-n* to provide improved thermal capacity for the device 200. Additionally, it is to be appreciated that, in certain embodiments, the device 200 can include one or more additional copper microcooler structures (e.g., the device 200 can include more than three copper microcooler structures). Additionally, it is to be appreciated that, the first set of copper channels 210*a-n* can include any number of copper channels, the second set of copper channels 214*a-n* can include any number of copper channels, and/or the third set of copper channels 218*a-n* can include any number of copper channels. In certain embodiments, the device 200 can be employed in a cooling system (e.g., a liquid cooling system) to maintain a temperature of one or more electronic components within a certain temperature range and/or to reduce a temperature of the one or more electronic components. In certain embodiments, a coolant fluid can be passed through the device 200 (e.g., the first set of copper channels 210*a-n*, the second set of copper channels 214*a-n*, and/or the third set of copper channels 218*a-n*) to maintain a temperature of one or more electronic components within a certain temperature range and/or to reduce a temperature of the one or more electronic components. In certain embodiments, an inlet manifold can receive the coolant fluid and can supply the coolant fluid to the device 200 (e.g., the first set of copper channels 210*a-n*, the second set of copper channels 214*a-n*, and/or the third set of copper channels 218*a-n*). The coolant fluid can be a liquid coolant. In some embodiments, the coolant fluid can be a liquid dielectric coolant. For example, the coolant fluid can be a liquid dielectric coolant such as a refrigerant (e.g., R1234ze, R134a, R245fa, etc.) or another type of liquid dielectric coolant (e g, ammonia, etc.). In another embodiment, the coolant fluid can be water.

Figure 3:
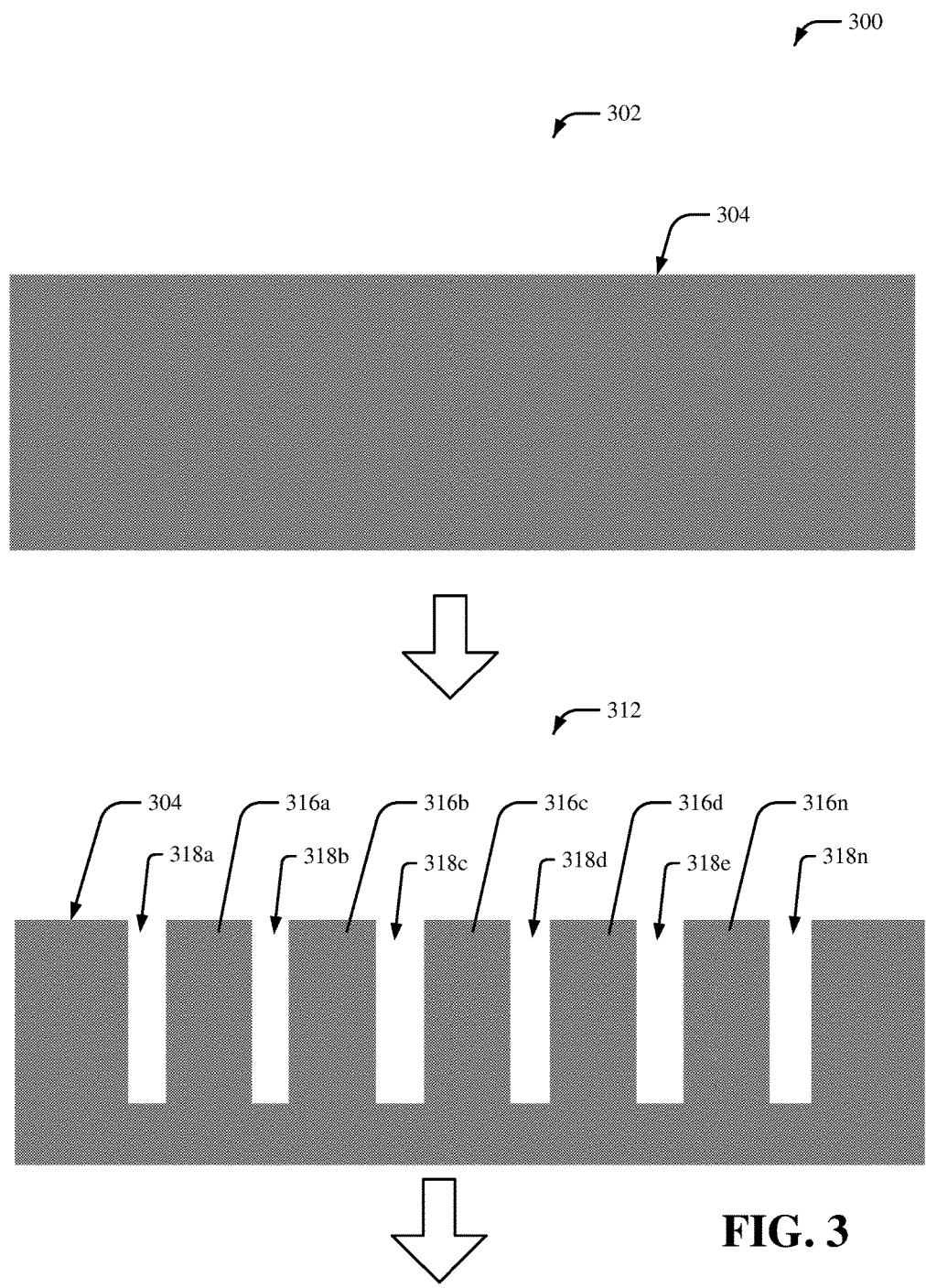
FIG. 3 illustrates an example, non-limiting fabrication process associated with intermediate copper microcooler structures in accordance with one or more embodiments described herein.
Figure 4:
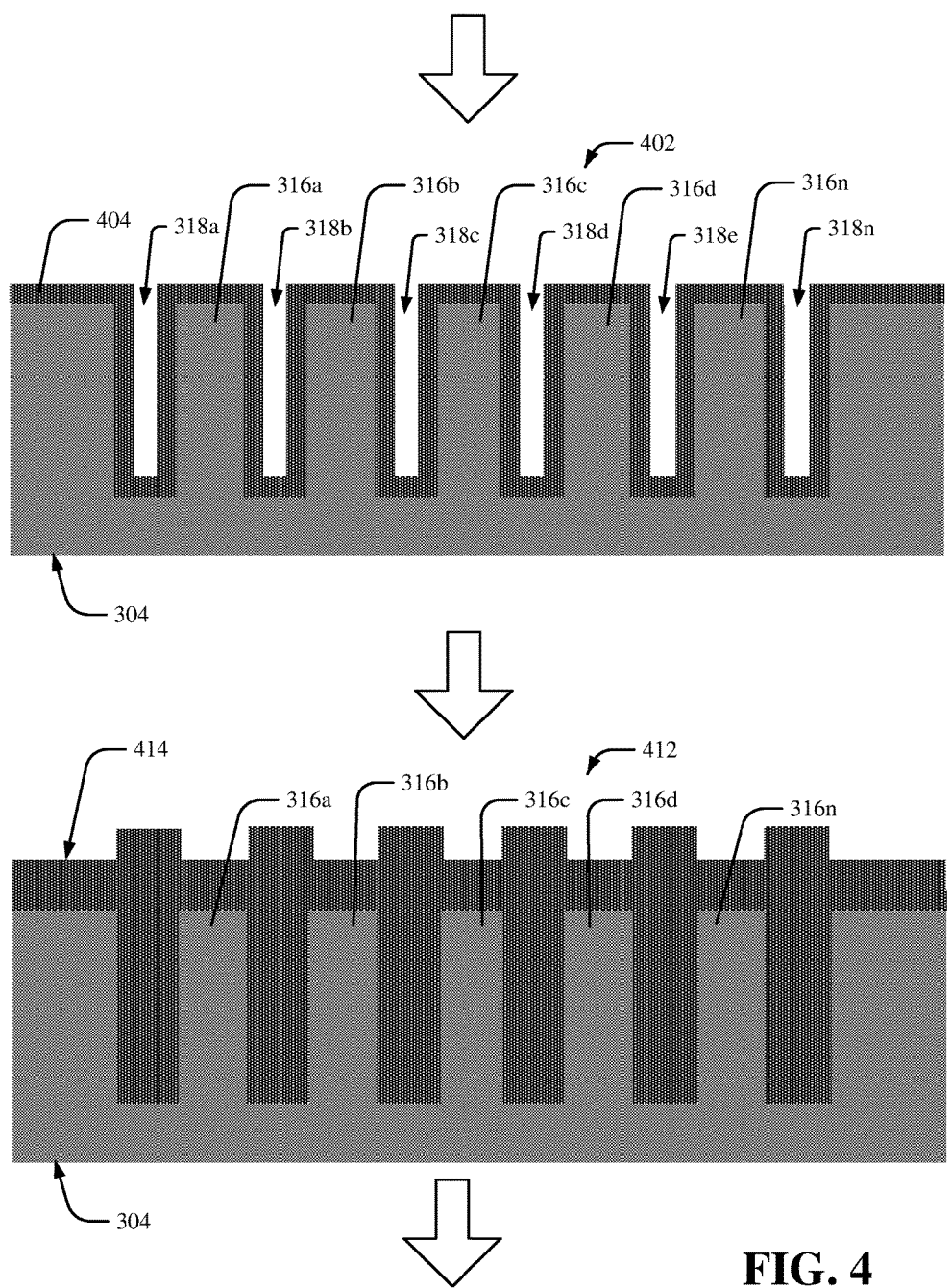
FIG. 4 further illustrates the example, non-limiting fabrication process associated with intermediate copper microcooler structures in accordance with one or more embodiments described herein.
Figure 5:
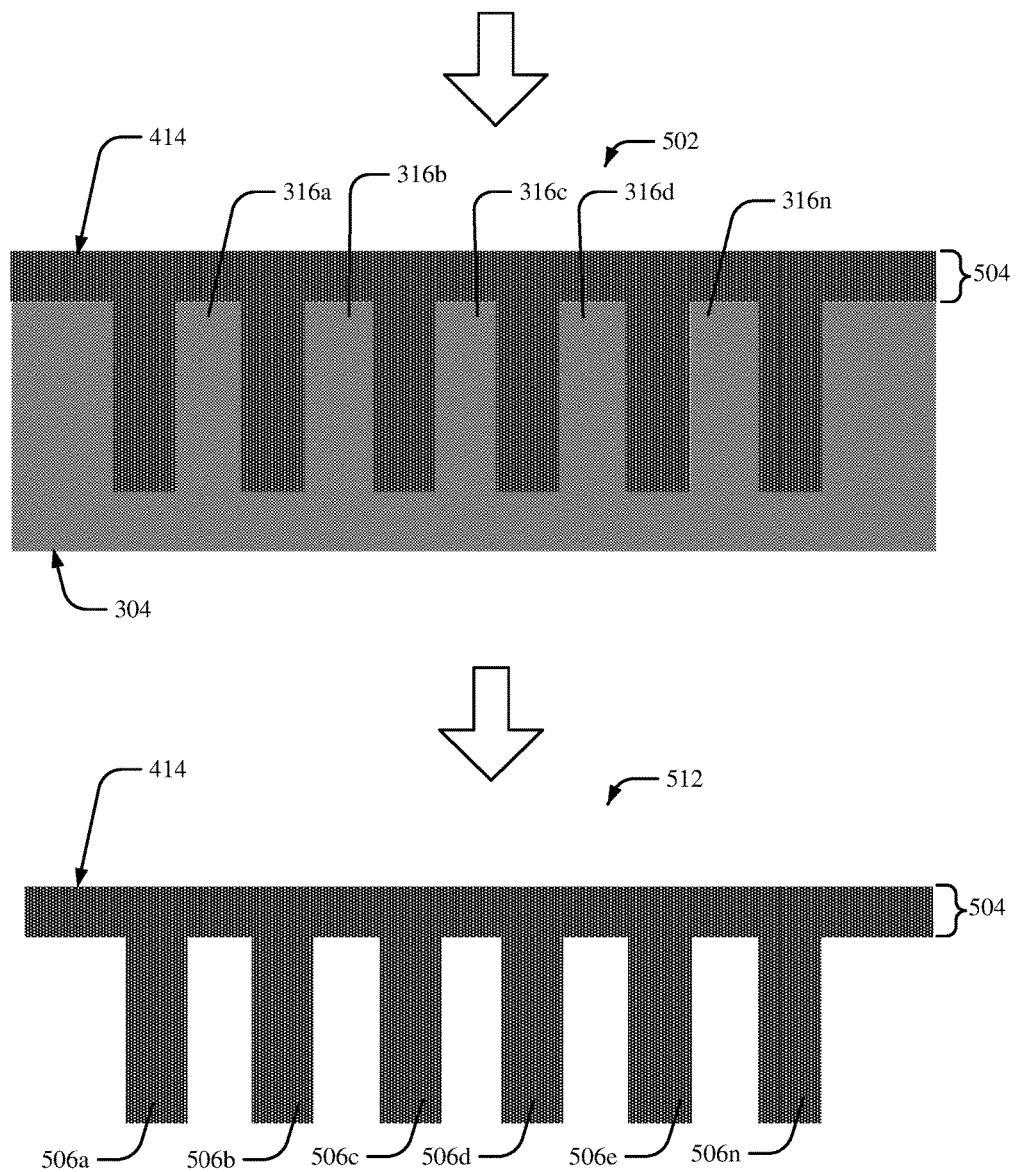
FIG. 5 further illustrates the example, non-limiting fabrication process associated with intermediate copper microcooler structures and also illustrates a copper microcooler structure in accordance with one or more embodiments described herein.

FIGS. 3-5 pictorially depict an example process 300 for fabricating a copper microcooler structure in accordance with one or more embodiments described herein. Repetitive description of like elements employed in other embodiments described herein is omitted for sake of brevity. With reference to FIGS. 3-5, presented is a cross-sectional view of an intermediate copper microcooler structure 302, an intermediate copper microcooler structure 312, an intermediate copper microcooler structure 402, an intermediate copper microcooler structure 412, an intermediate copper microcooler structure 502, and a copper microcooler structure 512.

Referring to FIG. 3, the intermediate copper microcooler structure 302 can include a substrate 304 in accordance with one or more embodiments described herein. Repetitive description of like elements employed in other embodiments described herein is omitted for sake of brevity. The substrate 304 can be, for example, a silicon substrate. For example, the substrate 304 can be a silicon wafer. However, it is to be appreciated that the substrate 304 can be a different type of semiconductor substrate such as, for example, silicon germanium, germanium, III-V materials, II-VI materials, or another type of semiconductor material. In an embodiment, a fabrication process can be performed to pattern one or more fins into the substrate 304 and to form the intermediate copper microcooler structure 312 from the intermediate copper microcooler structure 302. For example, the substrate 304 can be patterned to form a set of patterned fins 316a-n. The substrate 304 can also include a set of channels 318a-n associated with the set of patterned fins 316a-n. The set of channels 318a-n can be a set of recessed portions between patterned fins from the set of patterned fins 316a-n. In an embodiment, the set of patterned fins 316a-n and/or the set of channels 318a-n can be fabricated from the substrate 304 via a Bosch process associated with pulsed etching and/or time-multiplexed etching. In another embodiment, the set of patterned fins 316a-n and/or the set of channels 318a-n can be fabricated from the substrate 304 via a wet etching process that utilizes liquid (e.g., liquid chemicals) and masks to remove a portion of the substrate 304. For instance, the wet etching process can employ a wet etch solution containing, for example, potassium hydroxide, tetramethylammonium hydroxide, or another liquid chemical to remove a portion of the substrate 304. In yet another embodiment, the set of patterned fins 316a-n and/or the set of channels 318a-n can be fabricated from the substrate 304 via a patterning mask and lithography process. However, it is to be appreciated that in certain embodiments the set of patterned fins 316a-n and/or the set of channels 318a-n can be fabricated from the substrate 304 via a different process. The set of patterned fins 316a-n can be shaped as longitudinal-shaped patterned fins. However, it is to be appreciated that, in certain embodiments, the set of patterned fins 316a-n can be shaped as pin-shaped patterned fins, trapezoidal-shaped patterned fins, diamond-shaped patterned fins, or another type of patterned fins. In certain embodiments, the set of patterned fins 316a-n can include a set of transpiration holes.

Referring to FIG. 4, the intermediate copper microcooler structure 402 can include the substrate 304 and a copper liner layer 404 in accordance with one or more embodiments described herein. Repetitive description of like elements employed in other embodiments described herein is omitted for sake of brevity. The set of patterned fins 316a-n and/or the set of channels 318a-n can be formed in the substrate 304. The copper liner layer 404 can comprise copper. In an embodiment, the copper liner layer 404 can be a deep seed liner for copper plating. The copper liner layer 404 can be formed on a surface of the substrate 304. For instance, the copper liner layer 404 can be applied to one or more surfaces of the substrate 304, one or more surfaces of the set of patterned fins 316a-n and/or one or more surfaces of the set of channels 318a-n. In an embodiment, a fabrication process can be performed to apply copper material onto the copper liner layer 404 and to form the intermediate copper microcooler structure 412 from the intermediate copper microcooler structure 402. For instance, a portion of the copper liner layer 404 associated with the set of channels 318a-n can be filled with additional copper material. Additionally or alternatively, additional copper can be applied to a portion of the copper liner layer 404 associated with a surface of the set of patterned fins 316a-n and/or a portion of the copper liner layer 404 associated with a surface of the substrate 304 to form a copper channel structure 414. The additional copper can be applied to the copper liner layer 404 via a deposition process and/or a plating process to form the copper channel structure 414.

Referring to FIG. 5, the intermediate copper microcooler structure 502 can include the substrate 304 and the copper channel structure 414 in accordance with one or more embodiments described herein. Repetitive description of like elements employed in other embodiments described herein is omitted for sake of brevity. The set of patterned fins 316a-n and/or the set of channels 318a-n can be formed in the substrate 304. In an embodiment, a portion of the copper channel structure 414 can be planarized to form a copper plate 504. For instance, a portion of the copper channel structure 414 associated with copper overfill from the set of channels 318a-n can be flattened to form the copper plate 504. In an embodiment, a fabrication process can be performed to remove semiconductor material from the intermediate copper microcooler structure 502 and to form the copper microcooler structure 512 from the intermediate copper microcooler structure 502. For instance, the substrate 304 (e.g., the silicon template for the copper channel structure 414) can be removed from the intermediate copper microcooler structure 502 to form the copper microcooler structure 512. In an aspect, an etching process can be performed to remove the substrate 304 from the copper channel structure 414. The etching process can employ a chemical solution such as ammonia or another type of chemical solution to remove the substrate 304 from the copper channel structure 414. The copper microcooler structure 512 can include the copper plate 504 and a set of copper channels 506a-n attached to the copper plate 504. In an embodiment, the copper microcooler structure 512 can correspond to the first copper microcooler structure 102, the second copper microcooler structure 104, the first copper microcooler structure 202, the second copper microcooler structure 204, and/or the third copper microcooler structure 205.

FIGS. 6-13 pictorially depict an example process 600 for fabricating a copper microcooler structure in accordance with one or more embodiments described herein. Repetitive description of like elements employed in other embodiments described herein is omitted for sake of brevity. With reference to FIGS. 6-13, presented is a cross-sectional view of an intermediate copper microcooler structure 602, an intermediate copper microcooler structure 612, an intermediate copper microcooler structure 702, an intermediate copper microcooler structure 712, an intermediate copper microcooler structure 802, an intermediate copper microcooler structure 902, an intermediate copper microcooler structure 1002, an intermediate copper microcooler structure 1102, an intermediate copper microcooler structure 1202 and a copper microcooler structure 1302.

Figure 6:
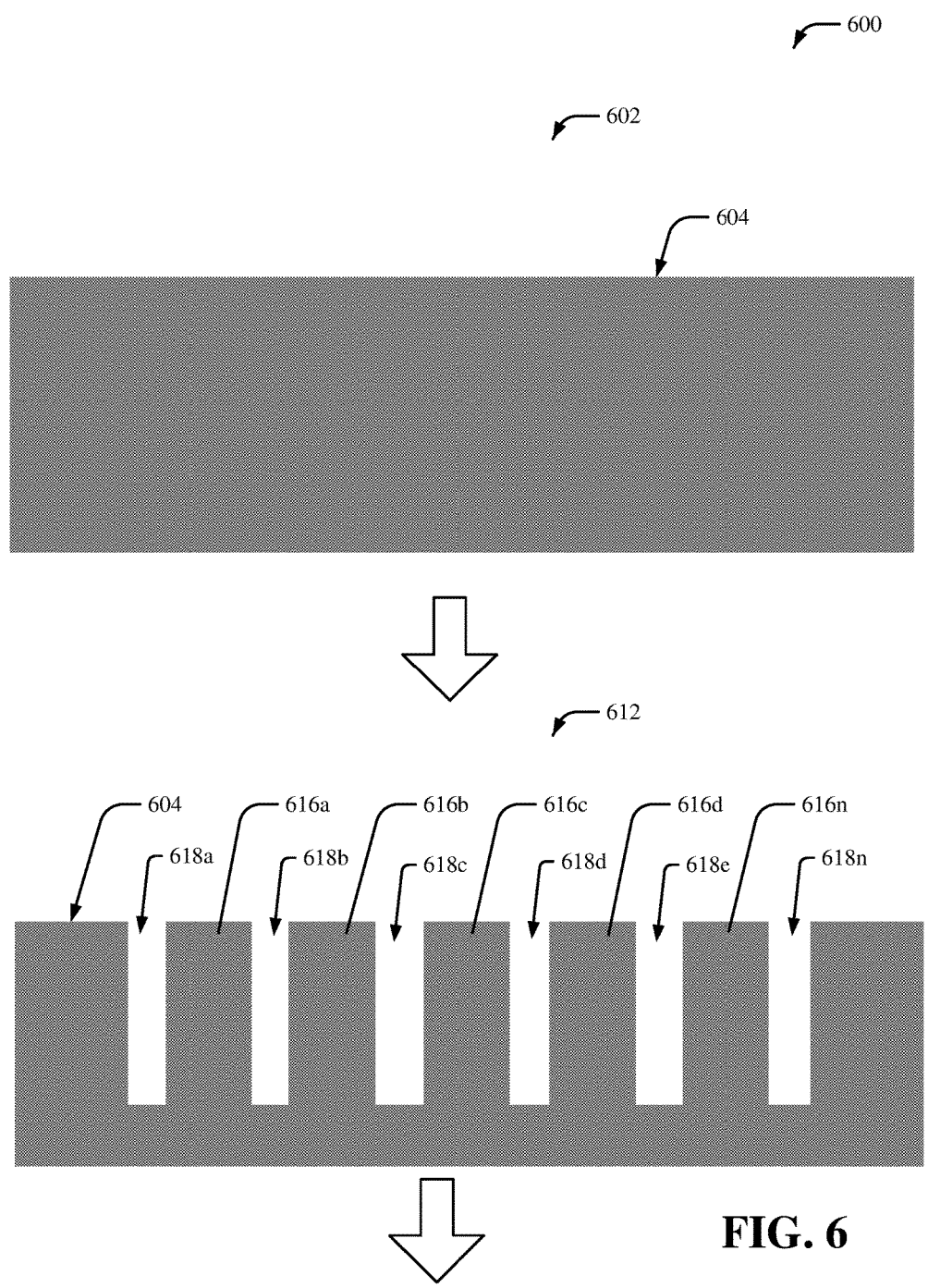
FIG. 6 illustrates another example, non-limiting fabrication process associated with intermediate copper microcooler structures in accordance with one or more embodiments described herein.

Referring to FIG. 6, the intermediate copper microcooler structure 602 can include a substrate 604 in accordance with one or more embodiments described herein. Repetitive description of like elements employed in other embodiments described herein is omitted for sake of brevity. The substrate 604 can be, for example, a silicon substrate. For example, the substrate 604 can be a silicon wafer. However, it is to be appreciated that the substrate 604 can be a different type of semiconductor substrate such as, for example, silicon germanium, germanium, III-V materials, II-VI materials, or another type of semiconductor material. In an embodiment, a fabrication process can be performed to pattern one or more fins into the substrate 604 and to form the intermediate copper microcooler structure 612 from the intermediate copper microcooler structure 602. For example, the substrate 604 can be patterned to form a set of patterned fins 616a-n. The substrate 604 can also include a set of channels 618a-n associated with the set of patterned fins 616a-n. The set of channels 618a-n can be a set of recessed portions between patterned fins from the set of patterned fins 616a-n. In an embodiment, the set of patterned fins 616a-n and/or the set of channels 618a-n can be fabricated from the substrate 604 via a Bosch process associated with pulsed etching and/or time-multiplexed etching. In another embodiment, the set of patterned fins 616a-n and/or the set of channels 618a-n can be fabricated from the substrate 604 via a wet etching process that utilizes liquid (e.g., liquid chemicals) and masks to remove a portion of the substrate 604. In yet another embodiment, the set of patterned fins 616a-n and/or the set of channels 618a-n can be fabricated from the substrate 604 via a patterning mask and lithography process. However, it is to be appreciated that in certain embodiments the set of patterned fins 616a-n and/or the set of channels 618a-n can be fabricated from the substrate 604 via a different process. The set of patterned fins 616a-n can be shaped as longitudinal-shaped patterned fins. However, it is to be appreciated that, in certain embodiments, the set of patterned fins 616a-n can be shaped as pin-shaped patterned fins, trapezoidal-shaped patterned fins, diamond-shaped patterned fins, or another type of patterned fins. In certain embodiments, the set of patterned fins 616a-n can include a set of transpiration holes.

Figure 7:
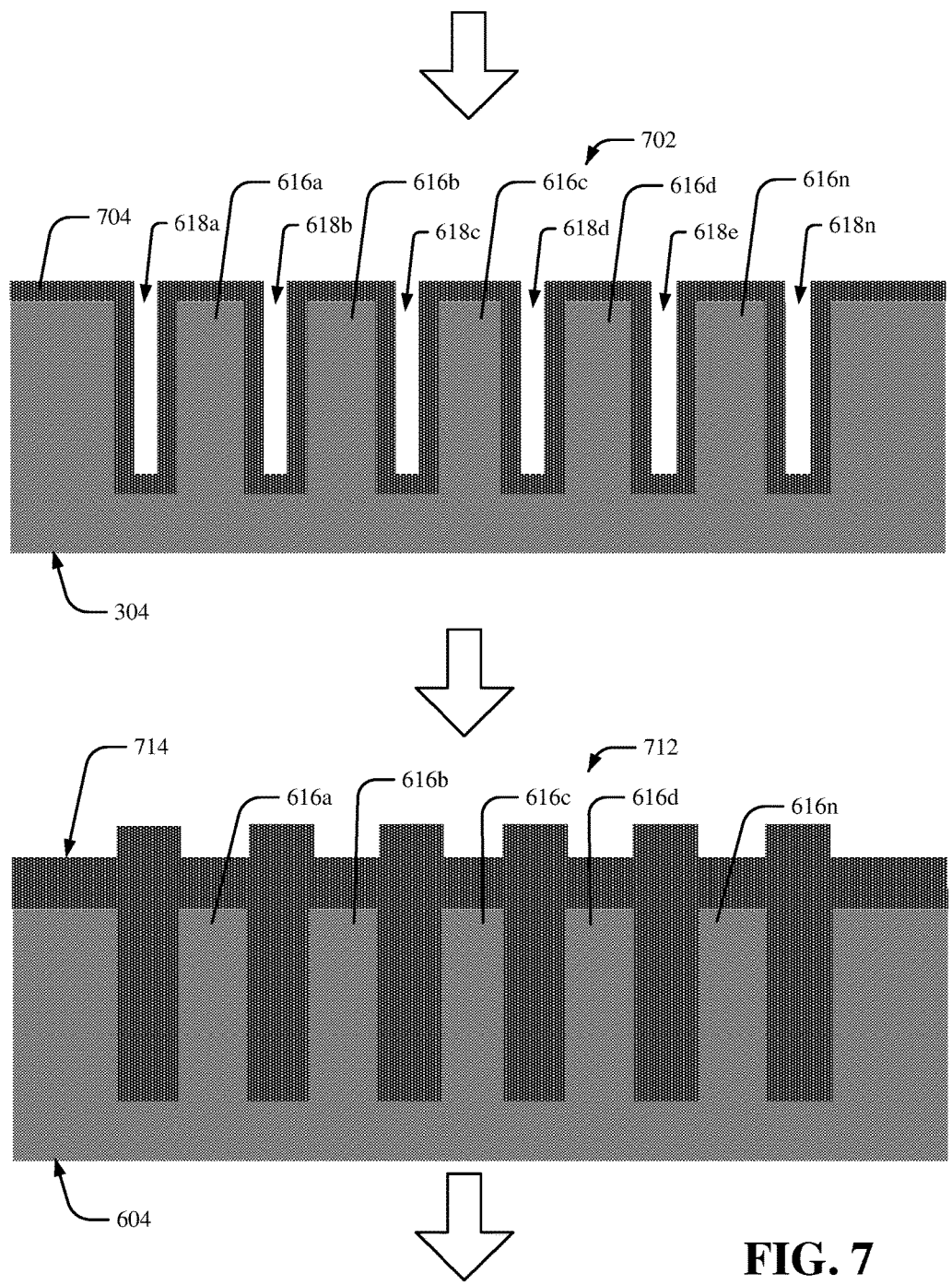
FIG. 7 further illustrates the other example, non-limiting fabrication process associated with intermediate copper microcooler structures in accordance with one or more embodiments described herein.

Referring to FIG. 7, the intermediate copper microcooler structure 702 can include the substrate 604 and a copper liner layer 704 in accordance with one or more embodiments described herein. Repetitive description of like elements employed in other embodiments described herein is omitted for sake of brevity. The set of patterned fins 616a-n and/or the set of channels 618a-n can be formed in the substrate 604. The copper liner layer 704 can comprise copper. In an embodiment, the copper liner layer 704 can be a deep seed liner for copper plating. The copper liner layer 704 can be formed on a surface of the substrate 604. For instance, the copper liner layer 704 can be applied to one or more surfaces of the substrate 604, one or more surfaces of the set of patterned fins 616a-n and/or one or more surfaces of the set of channels 618a-n. In an embodiment, a fabrication process can be performed to apply copper material onto the copper liner layer 704 and to form the intermediate copper microcooler structure 712 from the intermediate copper microcooler structure 702. For instance, a portion of the copper liner layer 704 associated with the set of channels 618a-n can be filled with additional copper material. Additionally or alternatively, additional copper can be applied to a portion of the copper liner layer 704 associated with a surface of the set of patterned fins 616a-n and/or a portion of the copper liner layer 704 associated with a surface of the substrate 604 to form a copper channel structure 714. The additional copper can be applied to the copper liner layer 704 via a deposition process and/or a plating process to form the copper channel structure 714.

Figure 8:
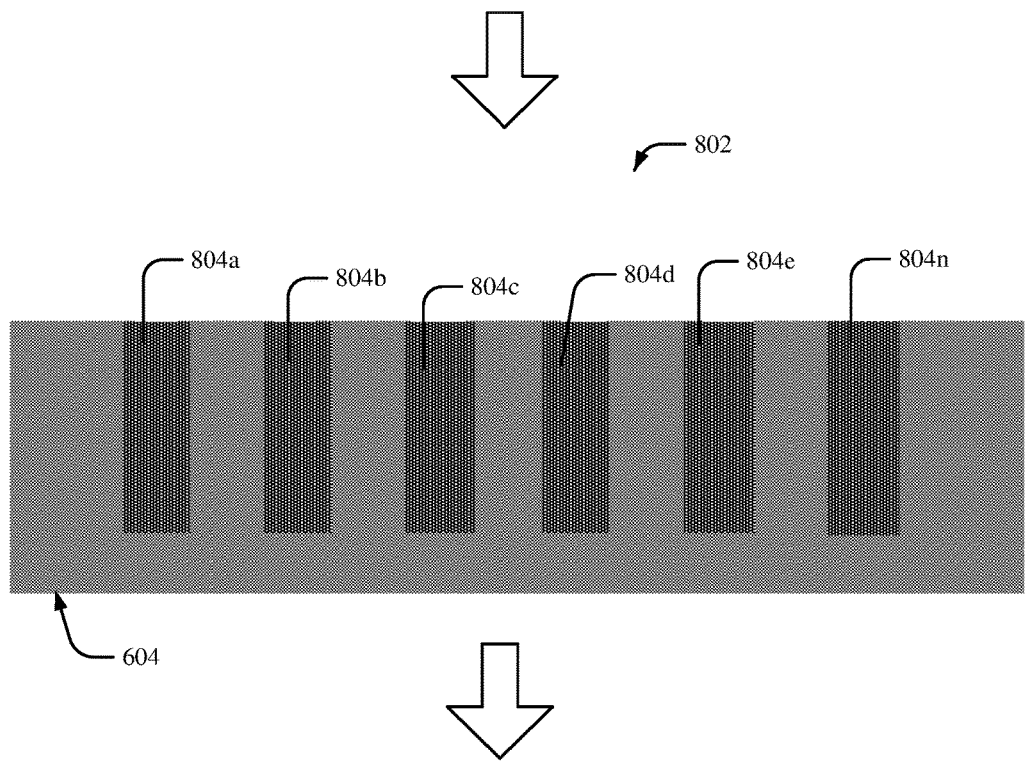
FIG. 8 further illustrates the other example, non-limiting fabrication process and also illustrates an intermediate copper microcooler structure in accordance with one or more embodiments described herein.

Referring to FIG. 8, the intermediate copper microcooler structure 802 can include the substrate 604 and a set of copper channels 804a-n in accordance with one or more embodiments described herein. Repetitive description of like elements employed in other embodiments described herein is omitted for sake of brevity. The set of copper channels 804a-n can be formed in the substrate 604. In an embodiment, a portion of the copper channel structure 714 can be planarized to form the set of copper channels 804a-n. For instance, a portion of the copper channel structure 714 associated with copper overfill from the set of channels 618a-n can be flattened to form the set of copper channels 804a-n. In an aspect, a size and/or a shape of the set of copper channels 804a-n can approximately correspond to a size and/or a shape of the set of channels 618a-n. In an embodiment, a chemical mechanical planarization process can be performed to form the set of channels 618a-n. For example, the chemical mechanical planarization process can be performed to remove a portion of copper channel structure 714 above the set of channels 618a-n.

Figure 9:
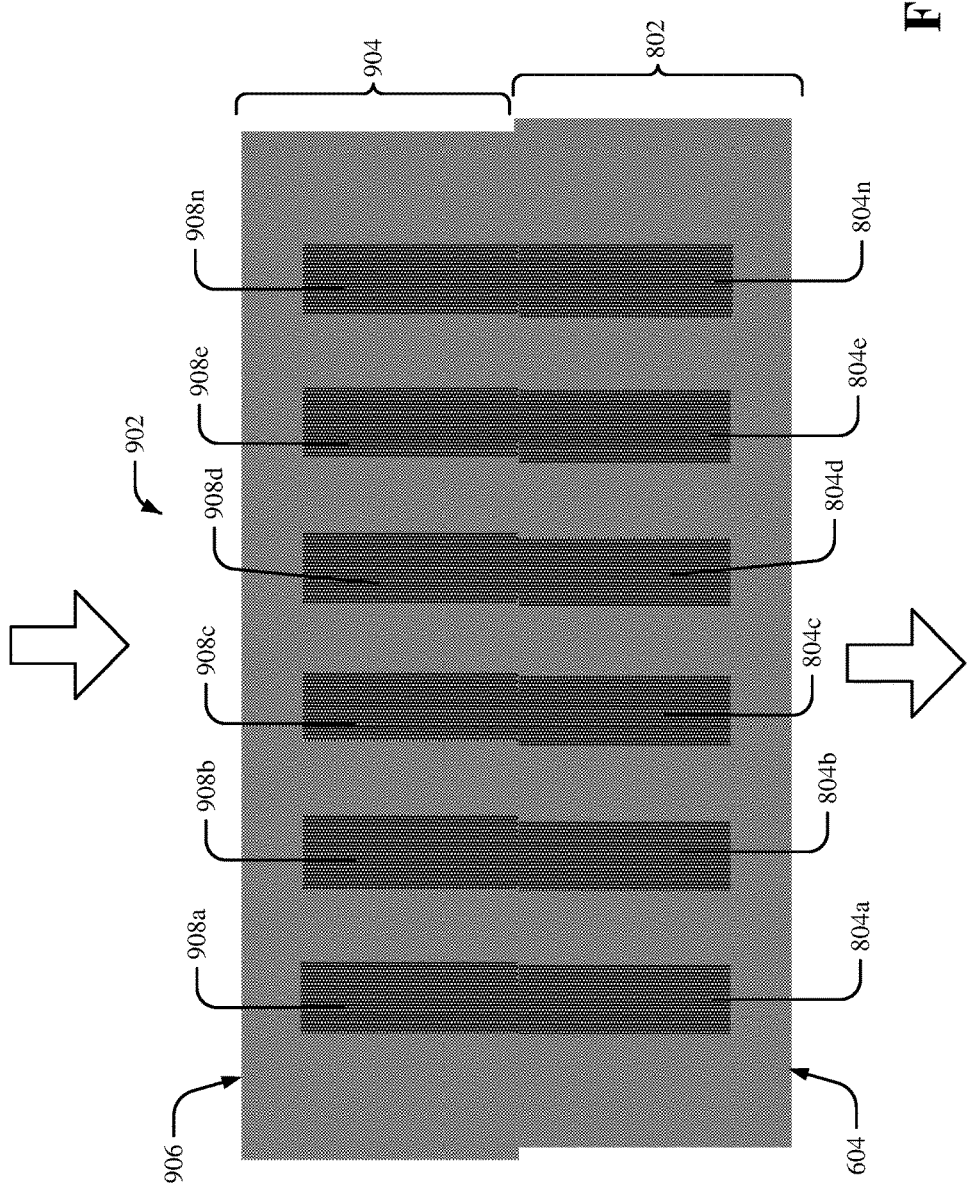
FIG. 9 further illustrates the other example, non-limiting fabrication process and also illustrates an intermediate copper microcooler structure in accordance with one or more embodiments described herein.

Referring to FIG. 9, the intermediate copper microcooler structure 902 can include the intermediate copper microcooler structure 802 and an intermediate copper microcooler structure 904 in accordance with one or more embodiments described herein. Repetitive description of like elements employed in other embodiments described herein is omitted for sake of brevity. The intermediate copper microcooler structure 802 can include the substrate 604 and the set of copper channels 804a-n. Furthermore, the intermediate copper microcooler structure 904 can include a substrate 906 and a set of copper channels 908a-n. The intermediate copper microcooler structure 802 can be bonded to the intermediate copper microcooler structure 902. For example, the intermediate copper microcooler structure 802 can be bonded to the intermediate copper microcooler structure 902 to increase a channel height of the set of copper channels 804a-n. In an embodiment, the intermediate copper microcooler structure 802 can be bonded to the intermediate copper microcooler structure 902 via a fusion bond. In an aspect, the substrate 604 that surrounds the set of copper channels 804a-n and/or the substrate 906 that surrounds the set of copper channels 908a-n can provide improved structural rigidity for the set of copper channels 804a-n and/or the set of copper channels 908a-n during bonding of the intermediate copper microcooler structure 802 and the intermediate copper microcooler structure 902. In an embodiment, the set of copper channels 908a-n can be approximately aligned with the set of copper channels 804a-n. For example, at least one copper channel from the set of copper channels 908a-n can be offset from a corresponding copper channel from the set of copper channels 804a-n by a certain amount. In a non-limiting example, the copper channel 908a can be offset from the copper channel 804a by a certain amount. In another embodiment, a width of one or more copper channels from the set of copper channels 908a-n and/or the set of copper channels 804a-n can be less than 250 microns. In an aspect, the intermediate copper microcooler structure 802 can be bonded to the intermediate copper microcooler structure 902 to provide improved thermal capacity.

Figure 10:
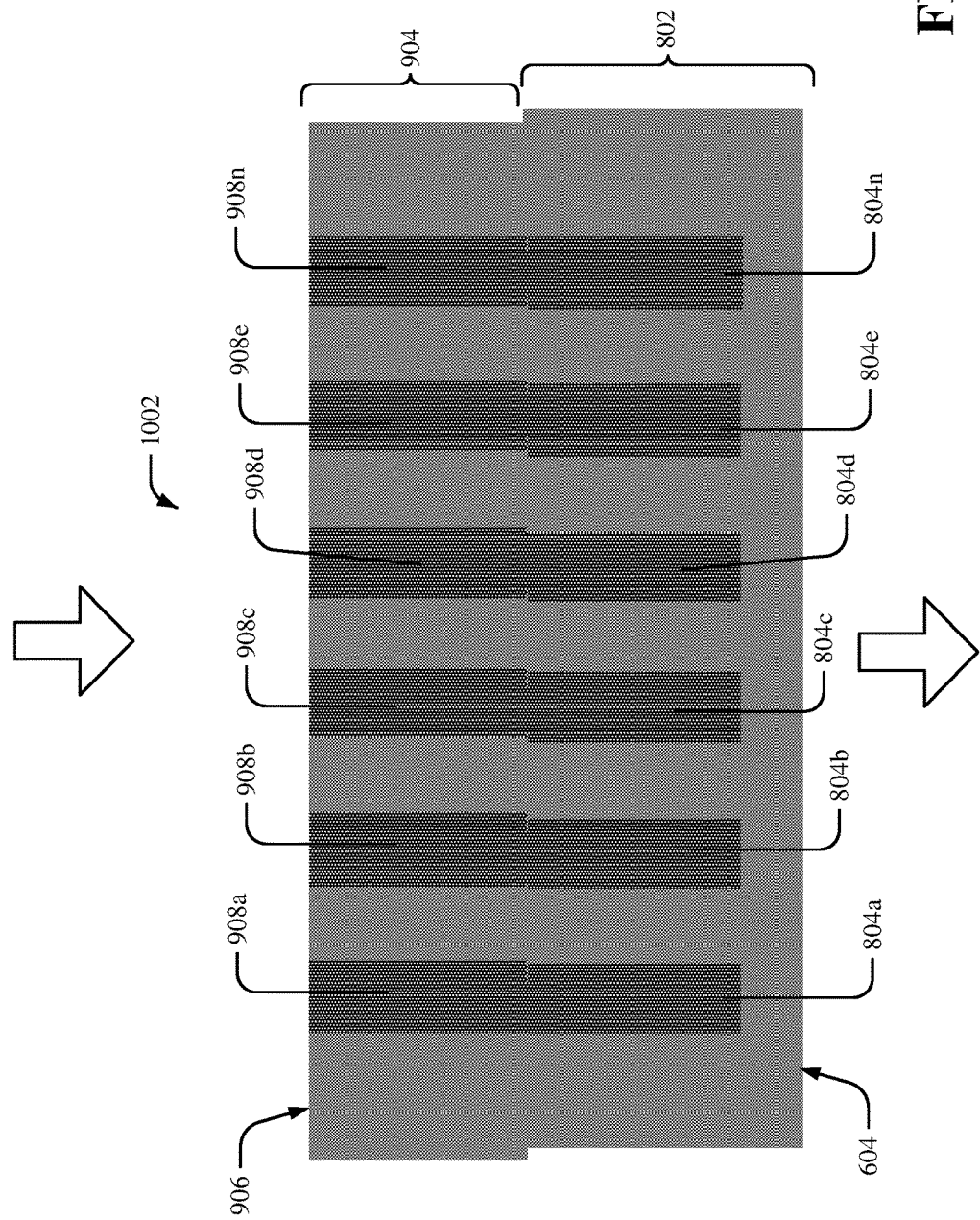
FIG. 10 further illustrates the other example, non-limiting fabrication process and also illustrates an intermediate copper microcooler structure in accordance with one or more embodiments described herein.

Referring to FIG. 10, the intermediate copper microcooler structure 1002 can include the intermediate copper microcooler structure 802 and the intermediate copper microcooler structure 904 in accordance with one or more embodiments described herein. Repetitive description of like elements employed in other embodiments described herein is omitted for sake of brevity. The intermediate copper microcooler structure 802 can include the substrate 604 and the set of copper channels 804a-n. Furthermore, the intermediate copper microcooler structure 904 can include the substrate 906 and the set of copper channels 908a-n. In an embodiment, a portion of the substrate 906 can be planarized to form the intermediate copper microcooler structure 904 shown in FIG. 10. For instance, a portion of the substrate 906 associated with excess substrate above the set of copper channels 908a-n can be flattened to form the intermediate copper microcooler structure 904 shown in FIG. 10.

Figure 11:
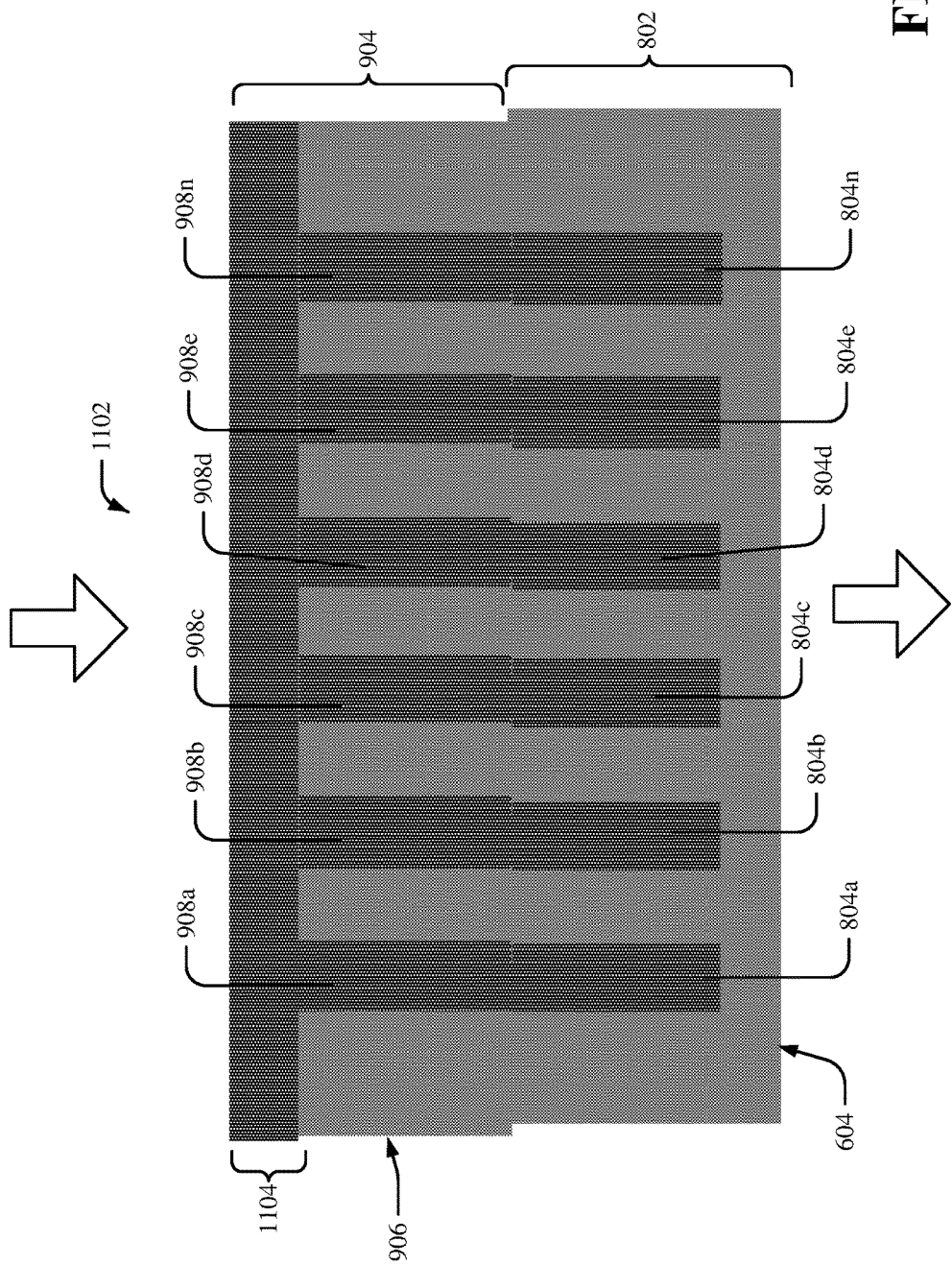
FIG. 11 further illustrates the other example, non-limiting fabrication process and also illustrates an intermediate copper microcooler structure in accordance with one or more embodiments described herein.

Referring to FIG. 11, the intermediate copper microcooler structure 1102 can include the intermediate copper microcooler structure 802 and the intermediate copper microcooler structure 904. The intermediate copper microcooler structure 802 can include the substrate 604 and the set of copper channels 804a-n. Furthermore, the intermediate copper microcooler structure 904 can include the substrate 906, the set of copper channels 908a-n and a copper plate 1104. The copper plate 1104 can be bonded to the set of copper channels 908a-n. For example, the copper plate 1104 can be bonded to the set of copper channels 908a-n via a fusion bond.

Figure 12:
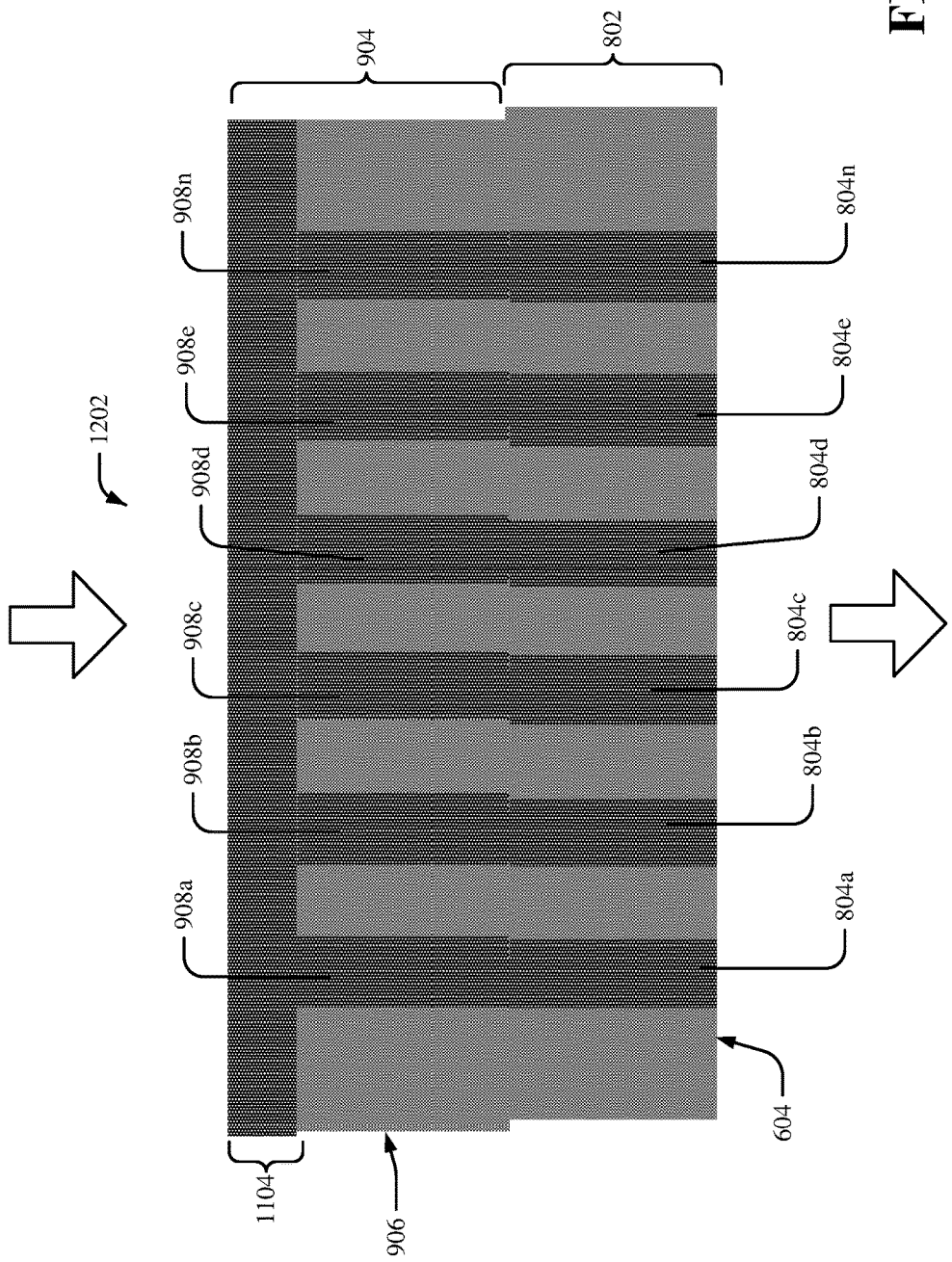
FIG. 12 further illustrates the other example, non-limiting fabrication process and also illustrates an intermediate copper microcooler structure in accordance with one or more embodiments described herein.

Referring to FIG. 12, the intermediate copper microcooler structure 1202 can include the intermediate copper microcooler structure 802 and the intermediate copper microcooler structure 904 in accordance with one or more embodiments described herein. Repetitive description of like elements employed in other embodiments described herein is omitted for sake of brevity. The intermediate copper microcooler structure 802 can include the substrate 604 and the set of copper channels 804a-n. Furthermore, the intermediate copper microcooler structure 904 can include the substrate 906, the set of copper channels 908a-n and the copper plate 1104. In an embodiment, a portion of the substrate 604 can be planarized to form the intermediate copper microcooler structure 802 shown in FIG. 12. For instance, a portion of the substrate 604 associated with excess substrate below the set of copper channels 804a-n can be flattened to form the intermediate copper microcooler structure 802 shown in FIG. 12.

Figure 13:
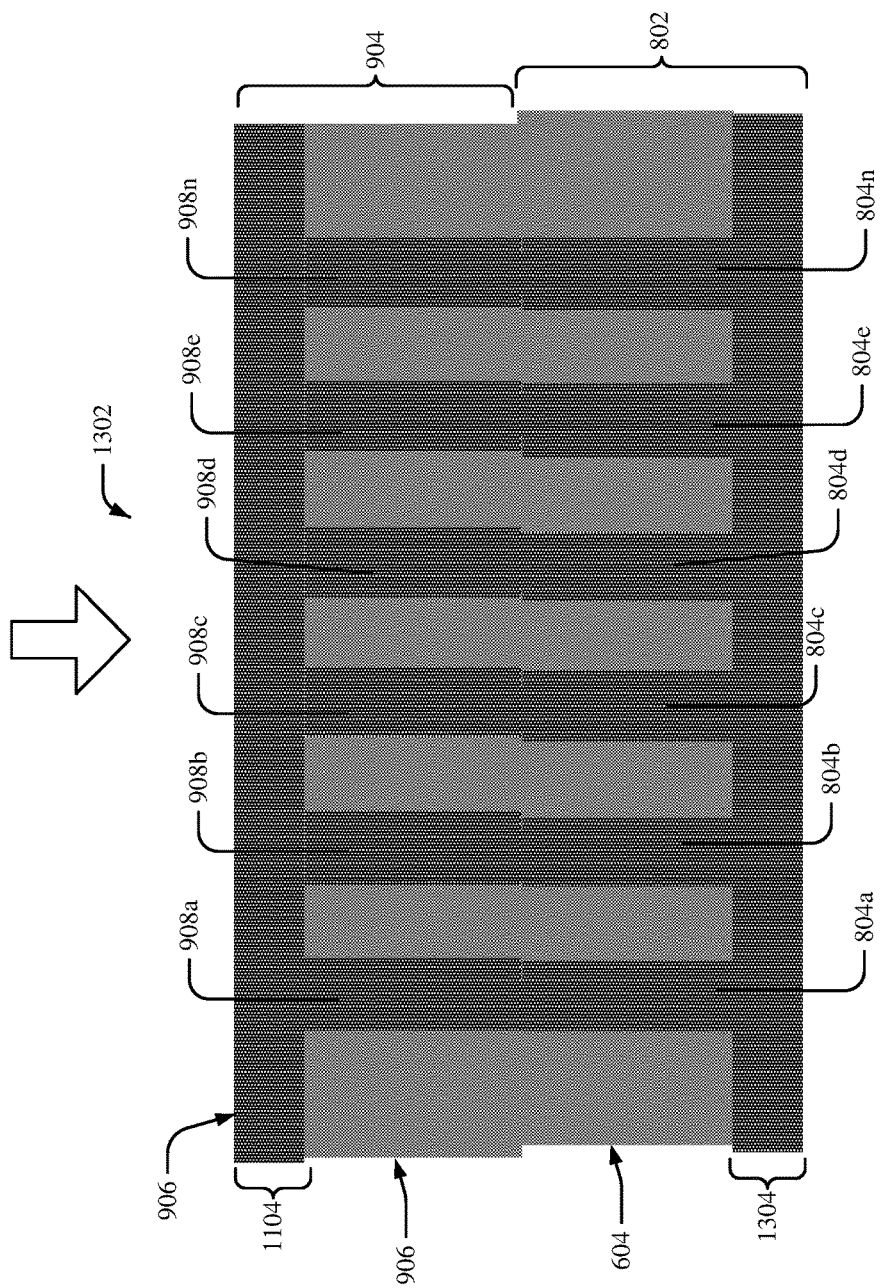
FIG. 13 further illustrates the other example, non-limiting fabrication process and also illustrates a copper microcooler structure in accordance with one or more embodiments described herein.

Referring to FIG. 13 the copper microcooler structure 1302 can include the intermediate copper microcooler structure 802 and the intermediate copper microcooler structure 904 in accordance with one or more embodiments described herein. Repetitive description of like elements employed in other embodiments described herein is omitted for sake of brevity. The intermediate copper microcooler structure 802 can include the substrate 604, the set of copper channels 804a-n and a copper plate 1304. Furthermore, the intermediate copper microcooler structure 904 can include the substrate 906, the set of copper channels 908a-n and the copper plate 1104. The copper plate 1304 can be bonded to the set of copper channels 804a-n. For example, the copper plate 1304 can be bonded to the set of copper channels 804a-n via a fusion bond. In an embodiment, the set of copper channels 908a-n can be approximately aligned with the set of copper channels 804a-n. For example, at least one copper channel from the set of copper channels 908a-n can be offset from a corresponding copper channel from the set of copper channels 804a-n by a certain amount. In a non-limiting example, the copper channel 908a can be offset from the copper channel 804a by a certain amount. In another embodiment, a width of one or more copper channels from the set of copper channels 804a-n and/or the set of copper channels 908a-n can be less than 250 microns. In an aspect, the set of copper channels 908a-n can be bonded to the set of copper channels 804a-n to provide improved thermal capacity for the copper microcooler structure 1302. Additionally, it is to be appreciated that, in certain embodiments, the copper microcooler structure 1302 can include one or more additional copper microcooler structures (e.g., the copper microcooler structure 1302 can include more than two intermediate copper microcooler structures). Additionally, it is to be appreciated that, the set of copper channels 804a-n can include any number of copper channels, and/or the set of copper channels 908a-n can include any number of copper channels. In certain embodiments, the copper microcooler structure 1302 can be employed in a cooling system (e.g., a liquid cooling system) to maintain a temperature of one or more electronic components within a certain temperature range and/or to reduce a temperature of the one or more electronic components. In certain embodiments, a coolant fluid can be passed through the copper microcooler structure 1302 (e.g., the set of copper channels 804a-n and/or the set of copper channels 908a-n) to maintain a temperature of one or more electronic components within a certain temperature range and/or to reduce a temperature of the one or more electronic components. In certain embodiments, an inlet manifold can receive the coolant fluid and can supply the coolant fluid to the copper microcooler structure 1302 (e.g., the set of copper channels 804a-n and/or the set of copper channels 908a-n). The coolant fluid can be a liquid coolant. In some embodiments, the coolant fluid can be a liquid dielectric coolant. For example, the coolant fluid can be a liquid dielectric coolant such as a refrigerant (e.g., R1234ze, R134a, R245fa, etc.) or another type of liquid dielectric coolant (e g, ammonia, etc.). In another embodiment, the coolant fluid can be water.

Figure 14:
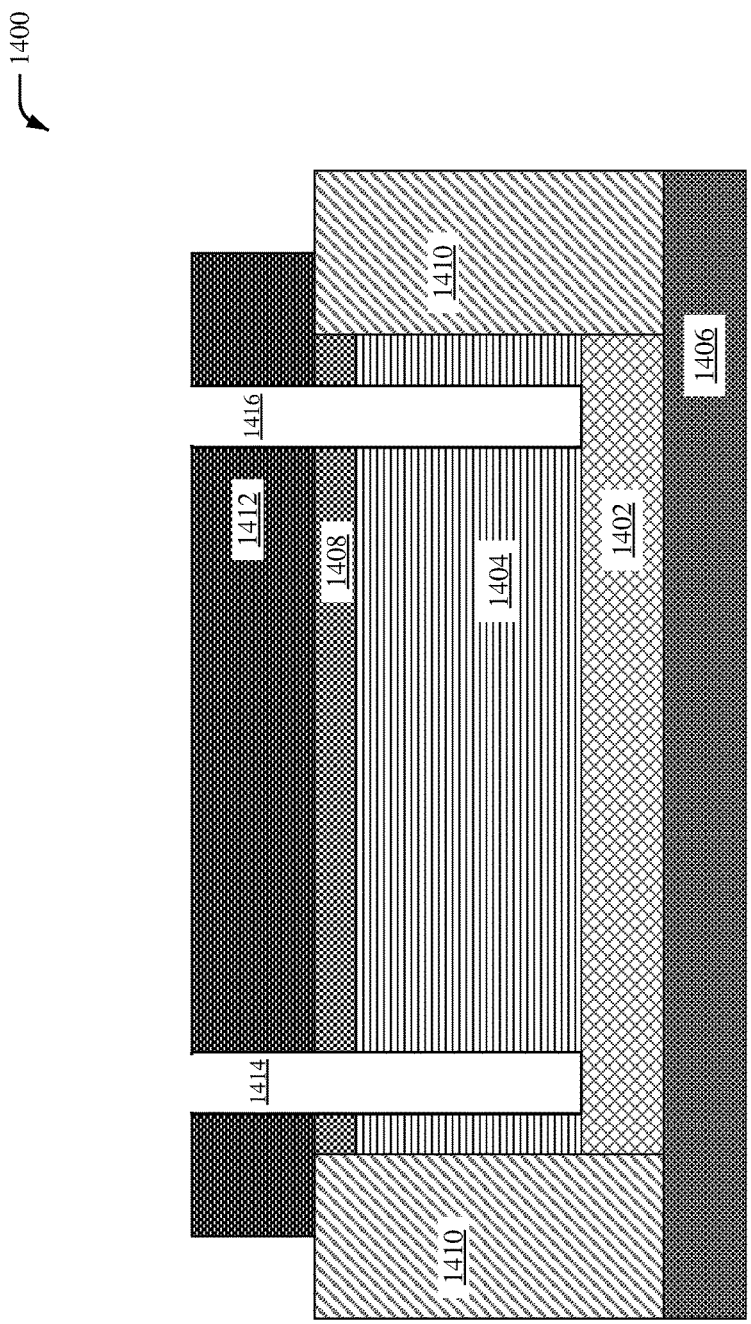
FIG. 14 illustrates an example, non-limiting system in accordance with one or more embodiments described herein.

FIG. 14 illustrates a side view of an example, non-limiting system 1400 in accordance with one or more embodiments described herein. Repetitive description of like elements employed in other embodiments described herein is omitted for sake of brevity.

The system 1400 can be, for example, a microcooler system. The system 1400 includes an electronic device 1402 and a microcooler 1404. The electronic device 1402 can be, for example, a computer chip such as a processor. The microcooler 1404 can be a microcooler structure as disclosed herein. For example, the microcooler 1404 can correspond to the device 100, the device 200, the copper microcooler structure 1302, etc. The microcooler 1404 can be attached to the electronic device 1402. For instance, the microcooler 1404 can be deposited on the electronic device 1402. In an embodiment, the electronic device 1402 can be deposited on a laminate layer 1406. Furthermore, a rubber pad layer 1408 can be deposited on the microcooler 1404. The microcooler 1404 can also be attached to a frame 1410. Furthermore, a metal plate 1412 can be attached to the frame 1410 and the rubber pad layer 1408. The metal plate 1412 can be, for example, a stainless steel plate. As such, the laminate layer 1406, the frame 1410 and/or the metal plate 1412 can correspond to an enclosure for the electronic device 1402 and/or the microcooler 1404. In another embodiment, the system 1400 can include an inlet port 1414 that can receive coolant fluid. The coolant fluid can be a liquid coolant. In some embodiments, the coolant fluid can be a liquid dielectric coolant. For example, the coolant fluid can be a liquid dielectric coolant such as a refrigerant (e.g., R1234ze, R134a, R245fa, etc.) or another type of liquid dielectric coolant (e g, ammonia, etc.). In another embodiment, the coolant fluid can be water. The inlet port 1414 can also supply the coolant fluid to the microcooler 1404. The coolant fluid can flow through the microcooler 1404 and an outlet port 1416 can provide an outlet for the coolant fluid.

Figure 15:
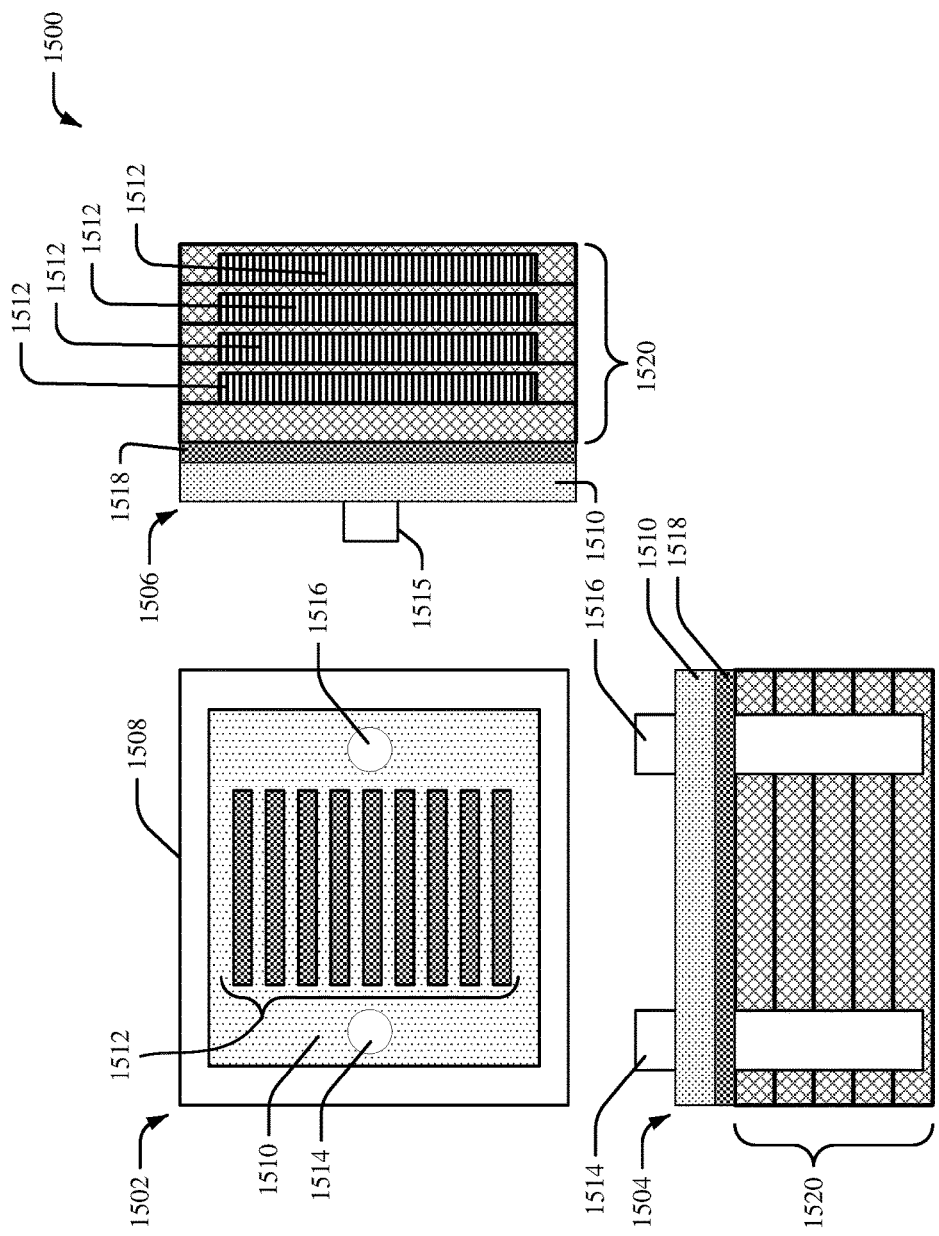
FIG. 15 illustrates another example, non-limiting system in accordance with one or more embodiments described herein.

FIG. 15 illustrates a side view of an example, non-limiting system 1500 in accordance with one or more embodiments described herein. Repetitive description of like elements employed in other embodiments described herein is omitted for sake of brevity.

The system 1500 can include a top view 1502, a side view 1504 and a side view 1506. The top view 1502 includes a frame 1508. The frame 1508 can comprise metal such as copper, aluminum or another type of alloy. Alternatively, the frame 1508 can comprise a ceramic material (e.g., aluminum nitride, etc.). The top view 1502 also includes a metal plate 1510. The metal plate 1510 can include an inlet port 1514 for providing an inlet for coolant fluid and an outlet port 1516 for providing an outlet for coolant fluid. The top view 1502 also includes a microcooler 1512. The microcooler 1512 can be a microcooler structure as disclosed herein. For example, the microcooler 1512 can correspond to the device 100, the device 200, the copper microcooler structure 1302, the microcooler 1404, etc. The side view 1504 includes the metal plate 1510, the inlet port 1514 and the outlet port 1516. The side view 1504 also includes a rubber pad layer 1518. The metal plate 1510 can be deposited on the rubber pad layer 1518. Furthermore, the rubber pad layer 1518 can be deposited on a set of stackable layers 1520. The set of stackable layers 1520 can comprise metal such as copper, aluminum or another type of alloy. Alternatively, the set of stackable layers 1520 can comprise a ceramic material (e.g., aluminum nitride, etc.). The set of stackable layers 1520 can includes a plurality of stackable layers attached together. In an embodiment, the set of stackable layers 1520 can be bonded together via indium bonds. The side view 1506 can include the set of stackable layers 1520. The set of stackable layers 1520 can include the microcooler structure 1512. The side view 1506 can also include the metal plate 1510 and the rubber pad layer 1518. The side view 1506 can also include inlet/outlet port 1515.

Figure 16:
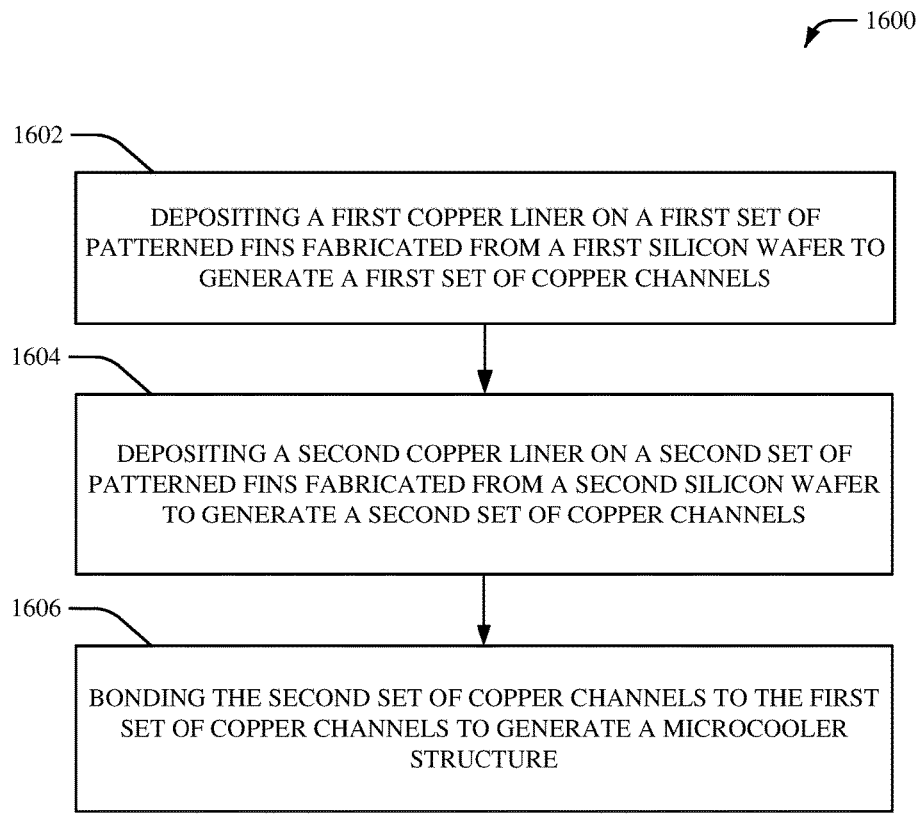
FIG. 16 illustrates a flow diagram of an example, non-limiting method for fabricating a microcooler structure in accordance with one or more embodiments described herein.

FIG. 16 illustrates a flow diagram of an example, non-limiting method 1600 for fabricating a microcooler structure in accordance with one or more embodiments described herein. Repetitive description of like elements employed in other embodiments described herein is omitted for sake of brevity.

At 1602, a first copper liner is deposited on a first set of patterned fins fabricated from a first silicon wafer to generate a first set of copper channels. In an embodiment, the first set of patterned fins can be fabricated from the first silicon wafer via a Bosch process associated with pulsed etching and/or time-multiplexed etching. In another embodiment, the first set of patterned fins can be fabricated from the first silicon wafer via a wet etching process that utilizes liquid (e.g., liquid chemicals) and masks to remove a portion of the substrate 304. In yet another embodiment, the first set of patterned fins can be fabricated from the first silicon wafer via a patterning mask and lithography process. However, it is to be appreciated that in certain embodiments first set of patterned fins can be fabricated from the first silicon wafer via a different process. In one example, the first set of patterned fins can be shaped as longitudinal-shaped patterned fins. In another example, the first set of patterned fins can be shaped as pin-shaped patterned fins. In yet another example, the first set of patterned fins can be shaped as trapezoidal-shaped patterned fins. In yet another example, the first set of patterned fins can be shaped as diamond-shaped patterned fins. The first copper liner can be a deep seed liner for copper plating. The first copper liner can be formed on a surface of the first silicon wafer. For instance, the first copper liner can be applied to one or more surfaces of the first silicon wafer, one or more surfaces of the first set of patterned fins and/or one or more surfaces of a set of channels associated with the first set of patterned fins. In certain embodiments, the first silicon wafer can be a different type of semiconductor wafer such as, for example, a silicon germanium wafer, a germanium wafer, a III-V material wafer, a II-VI material wafer, or another type of semiconductor wafer.

At 1604, a second copper liner is deposited on a second set of patterned fins fabricated from a second silicon wafer to generate a second set of copper channels. In an embodiment, the second set of patterned fins can be fabricated from the second silicon wafer via a Bosch process associated with pulsed etching and/or time-multiplexed etching. In another embodiment, the second set of patterned fins can be fabricated from the second silicon wafer via a wet etching process that utilizes liquid (e.g., liquid chemicals) and masks to remove a portion of the substrate 304. In yet another embodiment, the second set of patterned fins can be fabricated from the second silicon wafer via a patterning mask and lithography process. However, it is to be appreciated that in certain embodiments second set of patterned fins can be fabricated from the second silicon wafer via a different process. In one example, the second set of patterned fins can be shaped as longitudinal-shaped patterned fins. In another example, the second set of patterned fins can be shaped as pin-shaped patterned fins. In yet another example, the second set of patterned fins can be shaped as trapezoidal-shaped patterned fins. In yet another example, the second set of patterned fins can be shaped as diamond-shaped patterned fins. The second copper liner can be a deep seed liner for copper plating. The second copper liner can be formed on a surface of the second silicon wafer. For instance, the second copper liner can be applied to one or more surfaces of the second silicon wafer, one or more surfaces of the second set of patterned fins and/or one or more surfaces of a set of channels associated with the second set of patterned fins. In certain embodiments, the second silicon wafer can be a different type of semiconductor wafer such as, for example, a silicon germanium wafer, a germanium wafer, a III-V material wafer, a II-VI material wafer, or another type of semiconductor wafer.

At 1606, the second set of copper channels is bonded to the first set of copper channels to generate a microcooler structure. For example, the second set of copper channels can be bonded to the first set of copper channels via a fusion bond. In an embodiment, the second set of copper channels can be approximately aligned with the first set of copper channels. For example, at least one copper channel from the second set of copper channels can be offset from a corresponding copper channel from the first set of copper channels by a certain amount. In another embodiment, a width of one or more copper channels from the first set of copper channels and/or the second set of copper channels can be less than 250 microns. In certain embodiments, the second set of copper channels can be bonded to the first set of copper channels to provide improved thermal capacity for the microcooler structure.

In certain embodiments, the method 1600 can include planarizing a portion of the first copper liner to generate a first copper plate. Additionally or alternatively, the method 1600 can include planarizing a portion of the second copper liner to generate a second copper plate. In certain embodiments, the method 1600 can include removing the first silicon wafer from the first set of copper channels. Additionally or alternatively, the method 1600 can include removing the second silicon wafer from the second set of copper channels. In certain embodiments, the method 1600 can include bonding a copper plate to the second set of copper channels. In certain embodiments, the method 1600 can include depositing a third copper liner on a third set of patterned fins fabricated from a third silicon wafer to generate a third set of copper channels. Additionally or alternatively, the method 1600 can include bonding the third set of copper channels to the second set of copper channels to generate the microcooler structure. In certain embodiments, the method 1600 can include bonding a copper plate to the third set of copper channels.

Figure 17:
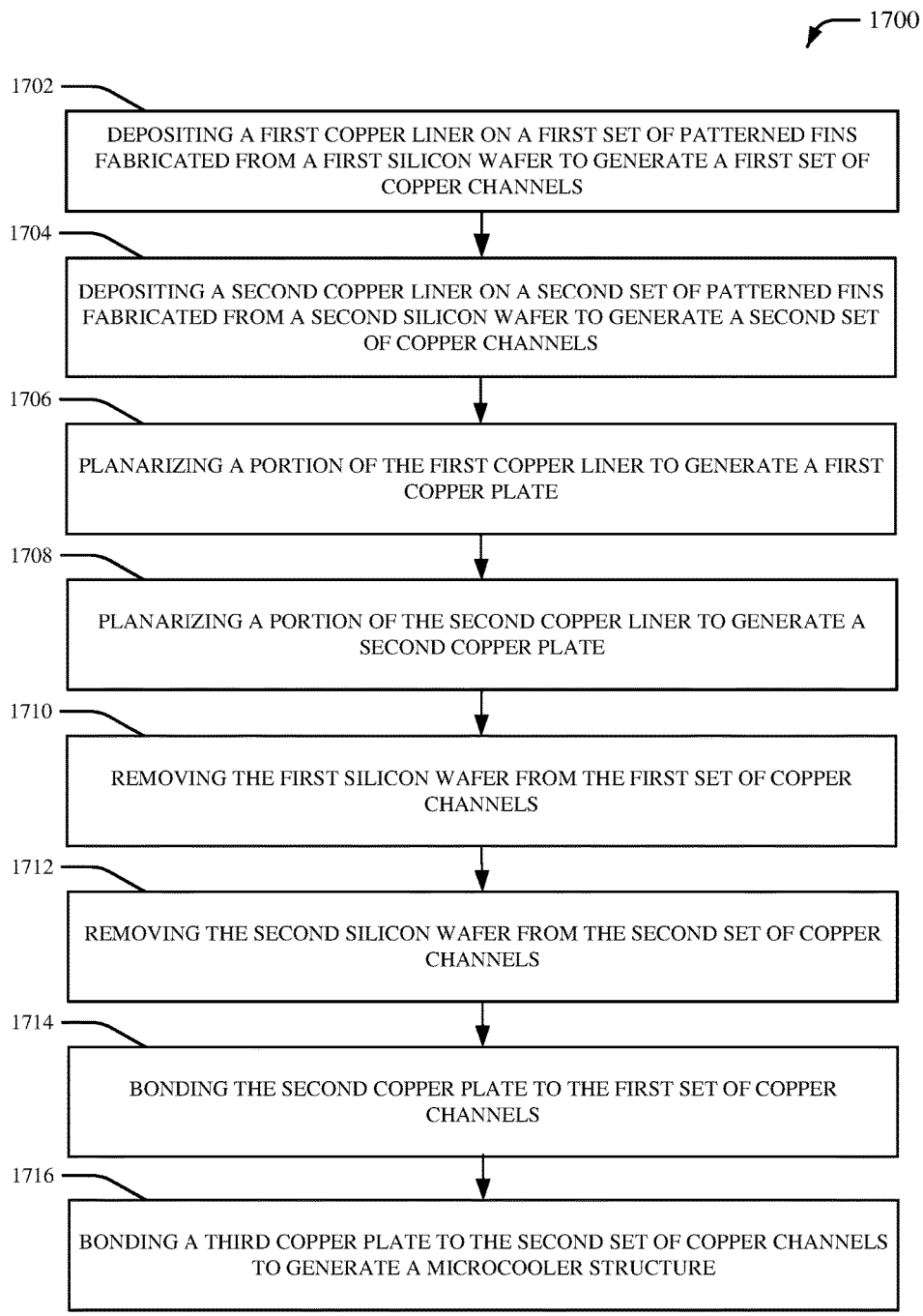
FIG. 17 illustrates a flow diagram of another example, non-limiting method for fabricating a microcooler structure in accordance with one or more embodiments described herein.

FIG. 17 illustrates a flow diagram of an example, non-limiting method 1700 for fabricating a microcooler structure in accordance with one or more embodiments described herein. Repetitive description of like elements employed in other embodiments described herein is omitted for sake of brevity.

At 1702, a first copper liner is deposited on a first set of patterned fins fabricated from a first silicon wafer to generate a first set of copper channels. In an embodiment, the first set of patterned fins can be fabricated from the first silicon wafer via a Bosch process associated with pulsed etching and/or time-multiplexed etching. In another embodiment, the first set of patterned fins can be fabricated from the first silicon wafer via a wet etching process that utilizes liquid (e.g., liquid chemicals) and masks to remove a portion of the substrate. In yet another embodiment, the first set of patterned fins can be fabricated from the first silicon wafer via a patterning mask and lithography process. However, it is to be appreciated that in certain embodiments first set of patterned fins can be fabricated from the first silicon wafer via a different process. In one example, the first set of patterned fins can be shaped as longitudinal-shaped patterned fins. In another example, the first set of patterned fins can be shaped as pin-shaped patterned fins. In yet another example, the first set of patterned fins can be shaped as trapezoidal-shaped patterned fins. In yet another example, the first set of patterned fins can be shaped as diamond-shaped patterned fins. The first copper liner can be a deep seed liner for copper plating. The first copper liner can be formed on a surface of the first silicon wafer. For instance, the first copper liner can be applied to one or more surfaces of the first silicon wafer, one or more surfaces of the first set of patterned fins and/or one or more surfaces of a set of channels associated with the first set of patterned fins. In certain embodiments, the first silicon wafer can be a different type of semiconductor wafer such as, for example, a silicon germanium wafer, a germanium wafer, a III-V material wafer, a II-VI material wafer, or another type of semiconductor wafer.

At 1704, a second copper liner is deposited on a second set of patterned fins fabricated from a second silicon wafer to generate a second set of copper channels. In an embodiment, the second set of patterned fins can be fabricated from the second silicon wafer via a Bosch process associated with pulsed etching and/or time-multiplexed etching. In another embodiment, the second set of patterned fins can be fabricated from the second silicon wafer via a wet etching process that utilizes liquid (e.g., liquid chemicals) and masks to remove a portion of the substrate 304. In yet another embodiment, the second set of patterned fins can be fabricated from the second silicon wafer via a patterning mask and lithography process. However, it is to be appreciated that in certain embodiments second set of patterned fins can be fabricated from the second silicon wafer via a different process. In one example, the second set of patterned fins can be shaped as longitudinal-shaped patterned fins. In another example, the second set of patterned fins can be shaped as pin-shaped patterned fins. In yet another example, the second set of patterned fins can be shaped as trapezoidal-shaped patterned fins. In yet another example, the second set of patterned fins can be shaped as diamond-shaped patterned fins. The second copper liner can be a deep seed liner for copper plating. The second copper liner can be formed on a surface of the second silicon wafer. For instance, the second copper liner can be applied to one or more surfaces of the second silicon wafer, one or more surfaces of the second set of patterned fins and/or one or more surfaces of a set of channels associated with the second set of patterned fins. In certain embodiments, the second silicon wafer can be a different type of semiconductor wafer such as, for example, a silicon germanium wafer, a germanium wafer, a III-V material wafer, a II-VI material wafer, or another type of semiconductor wafer.

At 1706, a portion of the first copper liner is planarized to generate a first copper plate. For instance, a portion of the first copper liner associated with copper overfill from a first set of channels associated with the first set of patterned fins can be flattened to form the first copper plate. The first copper plate can be attached to the first set of copper channels.

At 1708, a portion of the second copper liner is planarized to generate a second copper plate. For instance, a portion of the second copper liner associated with copper overfill from a second set of channels associated with the second set of patterned fins can be flattened to form the second copper plate. The second copper plate can be attached to the second set of copper channels.

At 1710, the first silicon wafer is removed from the first set of copper channels. For example, an etching process can be performed to remove the first silicon wafer from the first set of copper channels. The etching process can employ a chemical solution such as ammonia or another type of chemical solution to remove the first silicon wafer from the first set of copper channels.

At 1712, the second silicon wafer is removed from the second set of copper channels. For example, an etching process can be performed to remove the second silicon wafer from the second set of copper channels. The etching process can employ a chemical solution such as ammonia or another type of chemical solution to remove the second silicon wafer from the second set of copper channels.

At 1714, the second copper plate is bonded to the first set of copper channels. For example, the second copper plate can be bonded to the first set of copper channels via a fusion bond.

At 1716, a third copper plate is bonded to the second set of copper channels to generate a microcooler structure. For example, the third copper plate can be bonded to the second set of copper channels via a fusion bond. In an embodiment, the second set of copper channels can be approximately aligned with the first set of copper channels. For example, at least one copper channel from the second set of copper channels can be offset from a corresponding copper channel from the first set of copper channels by a certain amount. In another embodiment, a width of one or more copper channels from the first set of copper channels and/or the second set of copper channels can be less than 250 microns. In certain embodiments, the second set of copper channels can be bonded to the first set of copper channels to provide improved thermal capacity for the microcooler structure.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "electronic device" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, an electronic device and/or a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, electronic devices and/or processors can exploit nano-scale architectures such as, but not limited to, molecular and quantum-dot based transistors, switches and gates, in order to optimize space usage or enhance performance of user equipment. An electronic device and/or a processor can also be implemented as a combination of computing processing units.

What has been described above include mere examples of systems and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a first copper microcooler structure that comprises a first silicon substrate, a first copper plate and a first set of copper channels attached to the first copper plate; and
    a second copper microcooler structure that comprises a second silicon substrate, a second copper plate and a second set of copper channels attached to the second copper plate, wherein the second set of copper channels associated with the second copper microcooler structure is bonded to one or more surfaces of the first set of copper channels associated with the first copper microcooler structure via a fusion bond.

2. The device of claim 1, wherein the second set of copper channels is approximately aligned with the first set of copper channels.

3. The device of claim 1, wherein the first silicon substrate of the first copper microcooler structure is attached to the second silicon substrate of the second copper microcooler structure.

4. The device of claim 1, further comprising:
    a third copper microcooler structure bonded to the second copper microcooler structure.

5. The device of claim 4, wherein the third copper microcooler structure comprises a third set of copper channels.

6. The device of claim 5, wherein the third set of copper channels is approximately aligned with the second set of copper channels.

7. The device of claim 1, wherein a width of a channel from the first set of copper channels or the second set of copper channels is less than 250 microns.

8. The device of claim 1, wherein the second copper microcooler structure is bonded to the first set of copper channels of the first copper microcooler structure to provide improved thermal capacity for the device.

9. A method, comprising:
    depositing a first copper liner on a first set of patterned fins fabricated from a first silicon wafer to generate a first copper microcooler structure that comprises the first silicon wafer and a first set of copper channels;
    depositing a second copper liner on a second set of patterned fins fabricated from a second silicon wafer to generate a second copper microcooler structure that comprises the second silicon wafer and a second set of copper channels; and bonding the first copper microcooler structure to the second copper microcooler structure via a fusion bond.

10. The method of claim 9, further comprising:
planarizing a portion of the first copper microcooler structure; and
planarizing a portion of the second copper microcooler structure.

11. The method of claim 9, further comprising:
bonding a copper plate to the first set of copper channels.

12. The method of claim 9, further comprising:
bonding a copper plate to the second set of copper channels.

13. The method of claim 9, wherein the bonding comprises approximately aligning the second set of copper channels and the first set of copper channels.

14. The method of claim 9, wherein the bonding comprises providing improved thermal capacity for a microcooler structure associated with the first copper microcooler structure and the second copper microcooler structure.

15. A device, comprising:
a first copper microcooler structure that comprises a first copper plate and a first set of copper channels attached to the first copper plate; and
a second copper microcooler structure that comprises a second copper plate and a second set of copper channels attached to the second copper plate, wherein the second set of copper channels associated with the second copper microcooler structure is bonded to one or more surfaces of the first set of copper channels associated with the first copper microcooler structure via a fusion bond.

16. The device of claim 15, wherein the first copper microcooler structure comprises a first silicon wafer and the second copper microcooler structure comprises a second silicon wafer.

17. The device of claim 15, wherein the second set of copper channels is approximately aligned with the first set of copper channels.

18. The device of claim 16, further comprising:
a third copper microcooler structure bonded to the second copper microcooler structure.

19. The device of claim 18, wherein the third copper microcooler structure comprises a third set of copper channels.

20. The device of claim 15, wherein a width of a channel from the first set of copper channels or the second set of copper channels is less than 250 microns.

* * * * *